United States Patent
Yu et al.

(10) Patent No.: US 9,589,932 B2
(45) Date of Patent: Mar. 7, 2017

(54) INTERCONNECT STRUCTURES FOR WAFER LEVEL PACKAGE AND METHODS OF FORMING SAME

(71) Applicant: Taiwan Semiconductor Manufacturing Company, Ltd., Hsin-Chu (TW)

(72) Inventors: Chen-Hua Yu, Hsin-Chu (TW); Chung-Shi Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/174,606

(22) Filed: Jun. 6, 2016

(65) Prior Publication Data
US 2016/0284667 A1    Sep. 29, 2016

Related U.S. Application Data

(60) Division of application No. 14/686,530, filed on Apr. 14, 2015, now Pat. No. 9,373,604, which is a (Continued)

(51) Int. Cl.
*H01L 21/31*  (2006.01)
*H01L 25/065*  (2006.01)
(Continued)

(52) U.S. Cl.
CPC .... *H01L 25/0655* (2013.01); *H01L 21/31051* (2013.01); *H01L 21/31053* (2013.01); *H01L 21/4846* (2013.01); *H01L 21/565* (2013.01); *H01L 21/566* (2013.01); *H01L 21/568* (2013.01); *H01L 21/6835* (2013.01); *H01L 21/76877* (2013.01); *H01L 21/76885* (2013.01); *H01L 23/3135* (2013.01); *H01L 23/481* (2013.01); *H01L 23/528* (2013.01); *H01L 23/5384* (2013.01); *H01L 23/5389* (2013.01);
(Continued)

(58) Field of Classification Search
CPC ........... H01L 21/4846; H01L 21/31053; H01L 25/0655; H01L 25/0652; H01L 21/31051; H01L 21/565
See application file for complete search history.

(56) References Cited

U.S. PATENT DOCUMENTS

| 6,555,906 B2 | 4/2003 | Towle et al. |
| 7,619,901 B2 | 11/2009 | Eichelberger et al. |

(Continued)

FOREIGN PATENT DOCUMENTS

KR    20080094251 A    10/2008

*Primary Examiner* — Nathan W Ha
(74) *Attorney, Agent, or Firm* — Slater Matsil, LLP

(57) ABSTRACT

Representative methods are disclosed for fabricating device packages having a plurality of dies, a molding compound extending along sidewalls of the plurality of dies, and a polymer layer over and contacting the molding compound. The molding compound comprises a non-planar top surface, and a total thickness variation (TTV) of a top surface of the polymer layer is less than a TTV of the non-planar top surface of the molding compound. The device package further includes a conductive feature on the polymer layer, wherein the conductive feature is electrically connected at least one of the plurality of dies.

20 Claims, 26 Drawing Sheets

Related U.S. Application Data continuation-in-part of application No. 14/464,487, filed on Aug. 20, 2014, now Pat. No. 9,484,285.

(51) Int. Cl.

| | | |
|---|---|---|
| *H01L 23/31* | (2006.01) | |
| *H01L 21/56* | (2006.01) | |
| *H01L 21/3105* | (2006.01) | |
| *H01L 23/528* | (2006.01) | |
| *H01L 23/00* | (2006.01) | |
| *H01L 21/48* | (2006.01) | |
| *H01L 23/538* | (2006.01) | |
| *H01L 21/683* | (2006.01) | |
| *H01L 25/00* | (2006.01) | |
| *H01L 21/768* | (2006.01) | |
| *H01L 23/48* | (2006.01) | |
| *H01L 23/498* | (2006.01) | |

(52) U.S. Cl.
CPC .............. *H01L 24/06* (2013.01); *H01L 24/14* (2013.01); *H01L 24/19* (2013.01); *H01L 24/20* (2013.01); *H01L 25/50* (2013.01); *H01L 23/49816* (2013.01); *H01L 2221/68372* (2013.01); *H01L 2224/02371* (2013.01); *H01L 2224/0401* (2013.01); *H01L 2224/12105* (2013.01); *H01L 2224/13025* (2013.01); *H01L 2924/01029* (2013.01); *H01L 2924/1811* (2013.01); *H01L 2924/1815* (2013.01); *H01L 2924/18162* (2013.01); *H01L 2924/2064* (2013.01)

(56) References Cited

U.S. PATENT DOCUMENTS

| | | |
|---|---|---|
| 7,642,128 B1 | 1/2010 | Lin et al. |
| 8,097,490 B1 | 1/2012 | Pagaila et al. |
| 8,133,762 B2 | 3/2012 | Pagaila et al. |
| 8,193,604 B2 | 6/2012 | Lin et al. |
| 8,354,304 B2 | 1/2013 | Chow et al. |
| 8,474,133 B2 | 7/2013 | Eichelberger et al. |
| 8,742,579 B2 | 6/2014 | Pagaila et al. |
| 8,796,846 B2 | 8/2014 | Lin et al. |
| 2005/0027098 A1 | 2/2005 | Hayes |
| 2005/0121765 A1 | 6/2005 | Lin |
| 2009/0166785 A1 | 7/2009 | Camacho et al. |
| 2009/0224402 A1 | 9/2009 | Do et al. |
| 2009/0261358 A1* | 10/2009 | Chitnis ............... H01L 33/0095 257/88 |
| 2010/0148360 A1* | 6/2010 | Lin ..................... H01L 21/6835 257/737 |
| 2010/0258944 A1 | 10/2010 | Uchiyama et al. |
| 2011/0193216 A1 | 8/2011 | Lin et al. |
| 2011/0221041 A1 | 9/2011 | Lin et al. |
| 2012/0012991 A1* | 1/2012 | Chandrasekaran . H01L 23/3121 257/660 |
| 2012/0119378 A1 | 5/2012 | Ng et al. |
| 2012/0217643 A1 | 8/2012 | Pagaila et al. |
| 2012/0267777 A1 | 10/2012 | Haba et al. |
| 2012/0319284 A1 | 12/2012 | Ko et al. |
| 2013/0049214 A1 | 2/2013 | Nikitin et al. |
| 2013/0264684 A1 | 10/2013 | Yu et al. |
| 2014/0054760 A1 | 2/2014 | Yu et al. |
| 2014/0203443 A1 | 7/2014 | Pagaila et al. |
| 2014/0225222 A1 | 8/2014 | Yu et al. |
| 2014/0252572 A1 | 9/2014 | Hou et al. |
| 2015/0200188 A1 | 7/2015 | Yu et al. |

\* cited by examiner

INTERCONNECT STRUCTURES FOR WAFER LEVEL PACKAGE AND METHODS OF FORMING SAME

PRIORITY CLAIM AND CROSS-REFERENCE

This application is a divisional of U.S. patent application Ser. No. 14/686,530, filed on Apr. 14, 2015, entitled "Interconnect Structures for Wafer Level Package and Methods of Forming Same," which is a continuation-in-part of U.S. patent application Ser. No. 14/464,487, filed Aug. 20, 2014, entitled "Interconnect Structures for Wafer Level Package and Methods of Forming Same," which applications are hereby incorporated herein by reference.

BACKGROUND

In an aspect of conventional packaging technologies, such as wafer level packaging (WLP), redistribution layers (RDLs) may be formed over a die and electrically connected to active devices in a die. External input/output (I/O) pads such as solder balls on under-bump metallurgy (UBMs) may then be formed to electrically connect to the die through the RDLs. An advantageous feature of this packaging technology is the possibility of forming fan-out packages. Thus, the I/O pads on a die can be redistributed to a greater area than the die, and hence the number of I/O pads packed on the surfaces of the dies can be increased.

In such packaging technologies, a molding compound may be formed around the die to provide surface area to support the fan-out interconnect structures. For example, RDLs typically include one or more polymer layers formed over the die and molding compound. Conductive features (e.g., conductive lines and/or vias) are formed in the polymer layers and electrically connect I/O pads on the die to the external I/O pads over the RDLs. The external I/O pads may be disposed over both the die and the molding compound.

BRIEF DESCRIPTION OF THE DRAWINGS

Aspects of the present disclosure are best understood from the following detailed description when read with the accompanying figures. It is noted that, in accordance with standard practice in the industry, various features are not drawn to scale. In fact, the dimensions of the various features may be arbitrarily increased or reduced for clarity of discussion.

DETAILED DESCRIPTION

Figure 1A:
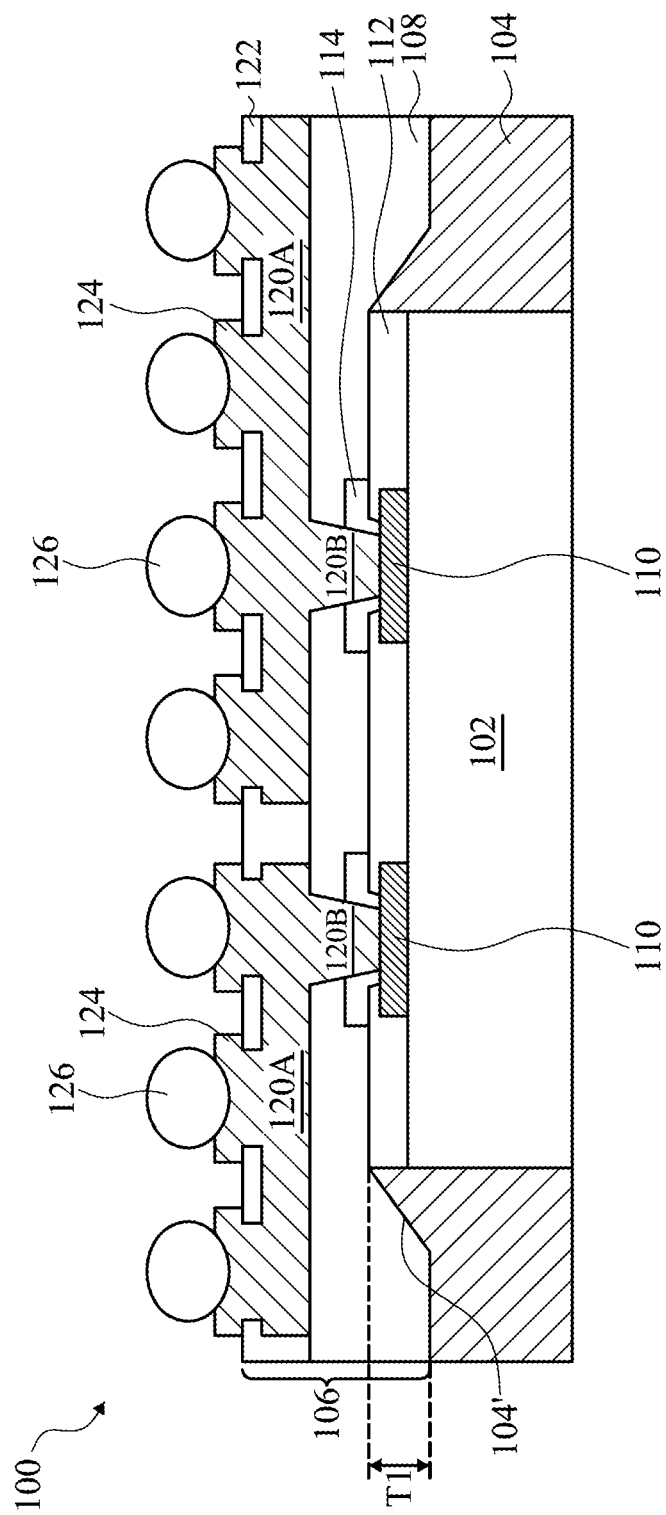
FIGS. 1A through 1D illustrate cross-sectional and top-down views of a device package in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Before addressing the illustrated embodiments specifically, certain advantageous features and aspects of the present disclosed embodiments will be addressed generally. In general terms, a new structure and method for polymer film coating (e.g., for redistribution layer (RDL) structures) on a molding compound surface is disclosed, which simplifies package processing and reduces process costs.

Described below is a method for forming a fan-out package and corresponding structure. In some embodiments, a molding compound is formed around a die using a transfer molding process. After the molding compound is formed, a top surface of a die may remain exposed. Thus, a grinding process (or other etch back technique) need not be performed on the molding compound to expose the die. Due to the transfer molding process, a top surface of the molding compound may have a total thickness variation (TTV, e.g., distance between a highest point and a lowest point of the top surface) of about 5 μm to about 10 μm. A polymer layer (e.g., a first RDL) is formed over the molding compound and the die and planarized using a pressure clamping/lamination process, for example. A total thickness variation of the polymer layer after planarization may be relatively small (e.g., less than about 5 μm), allowing for the reliable formation of additional RDL layers over the polymer layer. Thus, fan-out RDL structure may be formed over a die and molding compound using transfer molding and lamination processes, which may reduce overall costs of manufacturing the package.

FIG. 1A illustrates a cross-sectional view of a fan-out device package 100 in accordance with various embodiments. Package 100 includes a die 102, a molding compound 104 disposed around the die, and RDLs 106 (e.g., having conductive features 120) formed over die 102 and molding compound 104. Die 102 may be a semiconductor die and could be any type of integrated circuit, such as a processor, logic circuitry, memory, analog circuit, digital circuit, mixed signal, and the like. Die 102 may include a substrate, active devices, and an interconnect structure (not individually illustrated). The substrate may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, such as a silicon or glass substrate. Alternatively, the substrate may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

Active devices such as transistors, capacitors, resistors, diodes, photo-diodes, fuses, and the like may be formed at the top surface of the substrate. An interconnect structure may be formed over the active devices and the substrate. The interconnect structure may include inter-layer dielectric (ILD) and/or inter-metal dielectric (IMD) layers containing conductive features (e.g., conductive lines and vias comprising copper, aluminum, tungsten, combinations thereof, and the like) formed using any suitable method. The ILD and IMDs may include low-k dielectric materials having k values, for example, lower than about 4.0 or even 2.0 disposed between such conductive features. In some embodiments, the ILD and IMDs may be made of, for example, phosphosilicate glass (PSG), borophosphosilicate glass (BPSG), fluorosilicate glass (FSG), $SiO_xC_y$, Spin-On-Glass, Spin-On-Polymers, silicon carbon material, compounds thereof, composites thereof, combinations thereof, or the like, formed by any suitable method, such as spinning, chemical vapor deposition (CVD), and plasma-enhanced CVD (PECVD). The interconnect structure electrically connect various active devices to form functional circuits within die 102. The functions provided by such circuits may include memory structures, processing structures, sensors, amplifiers, power distribution, input/output circuitry, or the like. One of ordinary skill in the art will appreciate that the above examples are provided for illustrative purposes only to further explain applications of the present invention and are not meant to limit the present invention in any manner. Other circuitry may be used as appropriate for a given application.

Input/output (I/O) and passivation features may be formed over the interconnect structure. For example, contact pads 110 may be formed over the interconnect structure and may be electrically connected to the active devices through the various conductive features in the interconnect structure. Contact pads 110 may comprise a conductive material such as aluminum, copper, and the like. Furthermore, a passivation layer 112 may be formed over the interconnect structure and the contact pads. In some embodiments, passivation layer 112 may be formed of non-organic materials such as silicon oxide, silicon nitride, un-doped silicate glass, silicon oxynitride, and the like. Other suitable passivation materials may also be used. Portions of passivation layer 112 may cover edge portions of the contact pads 110.

Figure 1B:
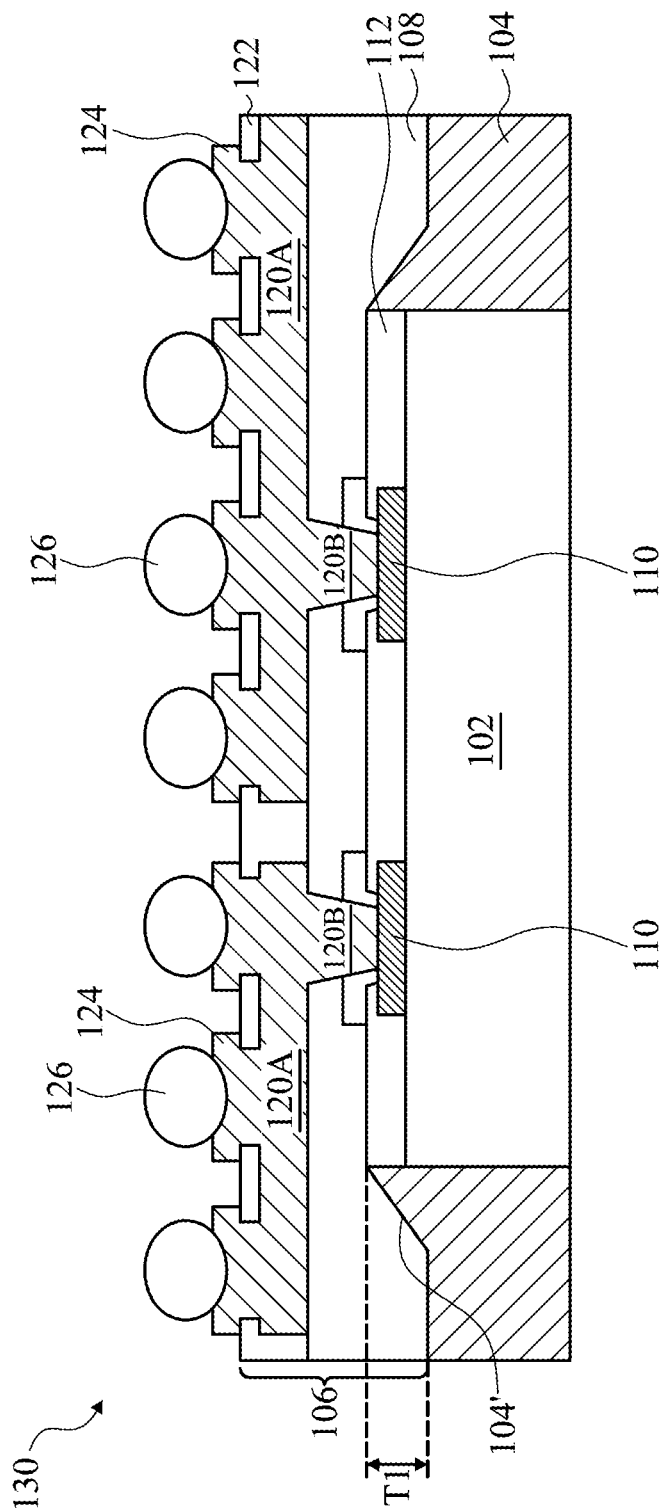

Additional interconnect features, such as additional passivation layers, conductive pillars, and/or under bump metallurgy (UBM) layers, may also be optionally formed over contact pad 110. For example, package 100 of FIG. 1A includes an UBM layer 114 over contact pad 110. UBM layer 114 may extend over and cover portions of passivation layer 112. In contrast, FIG. 1B illustrates a package 150 where UBM layer 114 is omitted. The various features of dies 102 may be formed by any suitable method and are not described in further detail herein. Furthermore, the general features and configuration of dies 102 described above are but one example embodiment, and dies 102 may include any combination of any number of the above features as well as other features.

Molding compound 104 is disposed around die 102. For example, in a top down view of molding compound 104/die 102 (not illustrated), molding compound 104 may encircle die 102. As will be described in greater detail in subsequent paragraphs, molding compound 104 may be formed using a transfer molding process, which does not cover a top surface of die 102. As a result of the transfer molding process, a top surface of molding compound 104 may not be substantially level. For example, molding compound 104 may include an inclined, recessed surface 104' against sidewalls of die 102. While FIG. 1A illustrates the inclined surface 104' as having a substantially linear profile, in other embodiments (see e.g., FIG. 1C), surface 104' may be non-linear (e.g., concave or convex). Other portions of the top surface of molding compound 104 may include similar variations in angle and height. In various embodiments, a TTV T1 of a top surface of molding compound 104 may be about 5 μm to about 30 μm.

One or more RDLs 106 may be formed over die 102 and molding compound 104. RDLs 106 may extend laterally past edges of die 102 to provide fan-out interconnect structures. RDLs 106 may include a bottom-most polymer layer 108 having a bottom surface contacting top surfaces of die 102 and molding compound 104. As will be explained subsequently in greater detail, polymer layer 108 may be formed using a lamination process such as vacuum lamination, heat press lamination, or the like. In some embodiments, polymer layer 108 may comprise polyimide, polybenzoxazole (PBO), epoxy, cyclic olefin polymer, an underfill film, a molded underfill film, or any other suitable lamination film material. Polymer layer 108 may or may not comprise any filler materials such as silica filler, glass filler, aluminum oxide, silicon oxide, and the like. Furthermore, a top surface of polymer layer 108 may be substantially level (or at least more level than molding compound 104) due to pressure clamping during the lamination process and/or a separate pressure clamping process. For example, a TTV of a top surface of polymer layer 108 may be less than TTV T1 of the molding compound to provide a suitable surface for forming additional features of RDLs 106. In an embodiment, a TTV of polymer layer 108 may be about 5 μm or less. In contrast, a bottom surface of polymer layer 108 may not be substantially level. For example, a bottom surface of polymer layer 108 in contact with molding compound 104 and may have a TTV T1 of about 5 μm to about 30 μm.

RDLs 106 may further include conductive features 120 (e.g., conductive lines 120A and conductive vias 120B) and additional polymer layers 122. Conductive lines 120A may be formed over polymer layer 108, and conductive vias 120B may extend through polymer layer 108 and electrically connect to contact pads 110 of die 102. Polymer layer 122 may also be formed over polymer layer 108. In various embodiments, polymer layer 122 may be lamination film material similar to polymer layer 108, which may be formed using a similar lamination process. Alternatively, polymer layer 122 may comprise another polymer material comprising, for example, polyimide (PI), PBO, benzocyclobuten (BCB), epoxy, silicone, acrylates, nano-filled pheno resin, siloxane, a fluorinated polymer, cyclic olefin polymer, polynorbornene, and the like formed using any suitable means such as spin-on techniques, and the like. RDLs 106 may further include any number of additional polymer layers having conductive features disposed therein (not shown) over polymer layer 122 and conductive features 120 based on package design.

Additional package features, such as external connectors 126 may be disposed over RDLs 106. Connectors 126 may be ball grid array (BGA) balls, controlled collapse chip connector (C4) bumps, and the like disposed on under metal metallurgies (UBMs) 124, which may be formed over RDLs 106. Connectors 126 may be electrically connected to die 102 by way of RDLs 106. Connectors 126 may be used to electrically connect package 100 to other package components such as another device die, interposers, package substrates, printed circuit boards, a mother board, and the like.

Figure 1C:
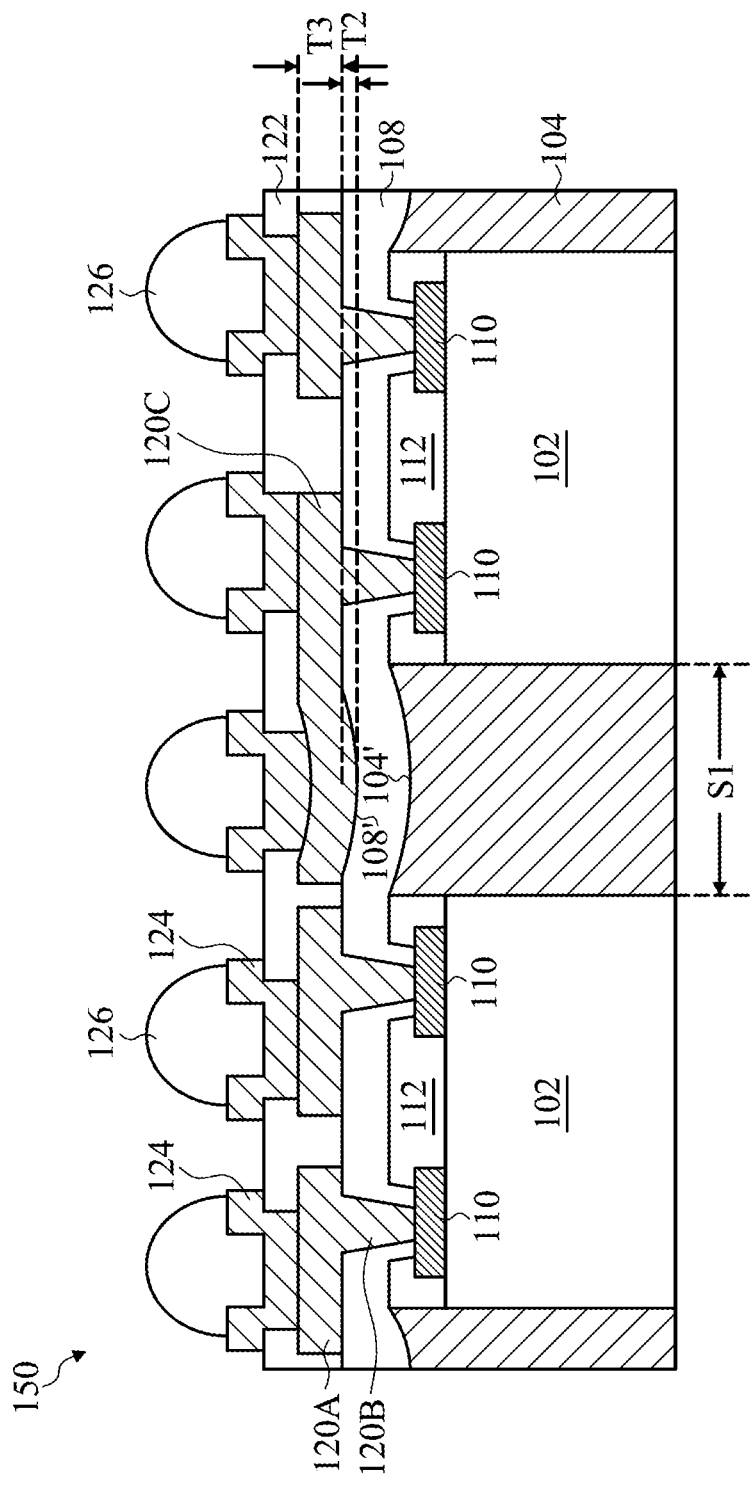
Figure 1D:
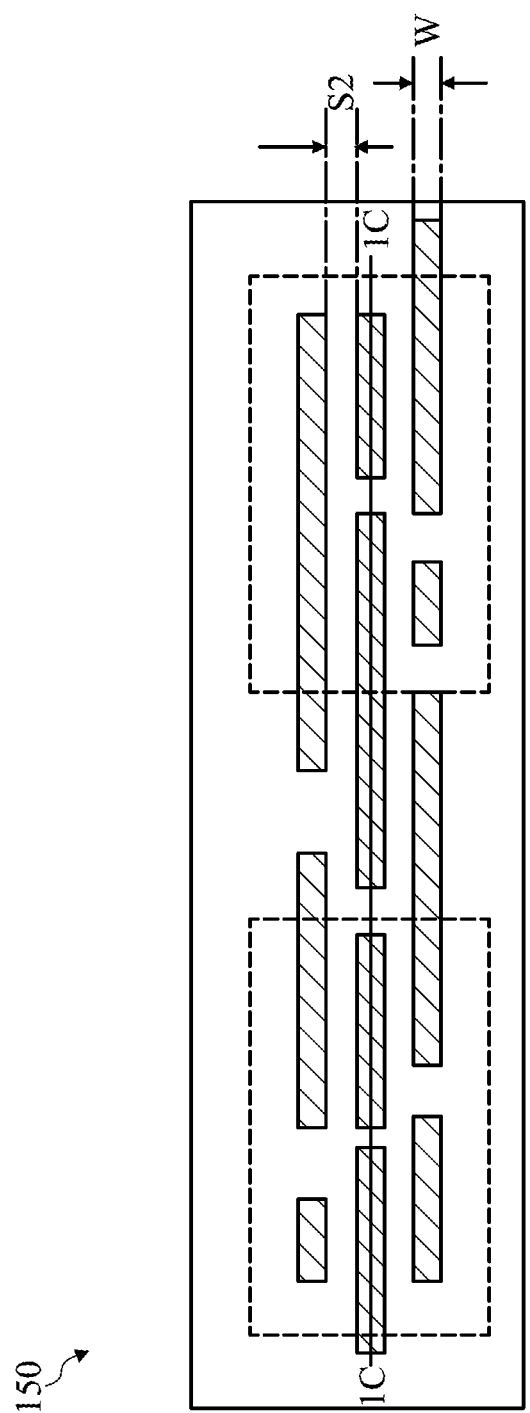

FIG. 1C illustrates a device package 150 having multiple dies in accordance with an embodiment. FIG. 1D illustrates a corresponding top-down view of conductive lines 120A and polymer layer 108 in package 150. The cross-section provided by FIG. 1C is taken across lines 1C-1C in FIG. 1D. The location of dies 102 are shown in ghost in FIG. 1D for ease of reference.

Package 150 includes similar features as package 100 or 130 where like reference numerals indicate like elements. As illustrated, package 150 includes at least two dies 102 spaced apart by a spacing S1. A molding compound 104 encapsulates and encircles dies 102, with a portion of molding compound 104 being disposed between dies 102. As described above, a top surface of molding compound 104 may not be substantially level due to a transfer molding process used to form molding compound 104. In some embodiments, a top surface of molding compound 104 between dies 102 (e.g., surface 104") may have a concave profile, and surface 104" may include a recess between dies 102. A TTV of surface 104" may be related to the dimension of spacing S1 between dies 102. For example, as spacing S1 increases, a corresponding TTV of surface 104" may also increase. In some embodiments, the TTV of surface 104" may be relatively large due to the spacing between dies 102. For example, a TTV of surface 104" may be greater than about 5 μm in an embodiment or even greater.

Polymer layer 108 is formed over dies 102 and molding compound 104. Polymer layer 108 may include a portion that is disposed between dies 102 and contacts molding compound 104 (e.g., surface 104" of molding compound 104), In various embodiments, the formation of polymer layer 108 includes a planarization process (e.g., pressure clamping/lamination) that reduces the TTV of polymer layer 108 even in areas where the TTV of molding compound 104 is relatively high. For example, a non-planar surface 108' of polymer layer 108 formed on concave surface 104" of molding compound 104 may have a relatively low TTV T2 (e.g., lower than the TTV of concave surface 104").

Furthermore, because surface 108' is disposed on concave surface 104", TTV T2 of surface 108' may also be related to the dimension of spacing S1 between dies 102. For example, as spacing S1 increases, TTV T2 may also increase. In various embodiment packages, TTV T2 may be relatively low even when spacing S1 is large. For example, in an embodiment, when spacing S1 is less than 3000 μm, TTV T2 may be less than about 15 μm. In an embodiment, when spacing S1 is less than about 500 μm, TTV T2 may be less than about 10 μm. In embodiment, when spacing S1 is less than about 100 μm, TTV T2 may be less than about 5 μm.

Conductive lines 120A are formed on polymer layer 108, and conductive lines 120A are electrically connected to dies 102 by conductive vias 120B, which extend through polymer layer 108. Conductive lines 120A may have a thickness T3 of about 5 μm, for example. In an embodiment, top surfaces of at least a portion of conductive lines 120A may also be non-planar (e.g., concave). It has been observed that by keeping the relation between die spacing S1 and TTV T2 of polymer layer 108 in the above ranges, fine pitched conductive lines (e.g. conductive lines 120A) may be reliably formed on polymer layer 108 (including on surface 108' between dies 102). For example, when conductive lines are formed on surfaces having a larger TTV and/or spanning greater distances between dies, relatively thick conductive lines may be required to ensure sufficient material is available to cover dips in the surface and to reduce the risk of forming defects (e.g., gaps) in the resulting lines. By maintaining the TTV of polymer layer 108 in the above ranges, fine pitched conductive lines 120A may be reliably formed even in areas where molding compound 104 has a relatively high TTV (e.g., between dies). In some embodiments, conductive lines 120A may have a width W1 less than about 10 μm, and a spacing S2 between adjacent conductive lines 120A may be less than about 10 μm (see e.g., the top-down view of wafer 150 in FIG. 1D). Thus, a multiple die embodiment package allows for fine pitched conductive lines 120A to be reliably formed directly on a polymer layer even in areas between dies.

Figure 2:
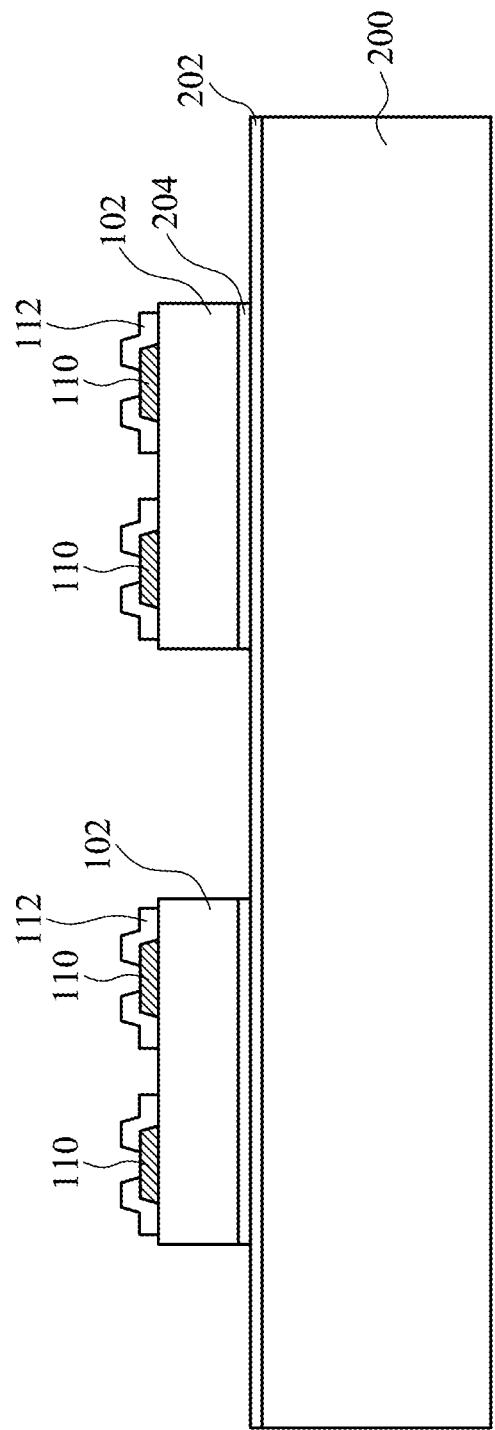
FIGS. 2 through 13 illustrate cross-sectional views of intermediary steps of manufacturing a device package in accordance with some embodiments.

FIGS. 2 through 5 illustrate cross-sectional views of various intermediary stages of forming molding compound 104 and polymer layer 108 in accordance with various embodiments. Referring to FIG. 2, dies 102 are mounted on a carrier 200. Generally, the carrier 200 provides temporary mechanical and structural support to the dies 102 during subsequent processing steps. In this manner, damage to dies 102 is reduced or prevented. Carrier 200 may comprise, for example, glass, silicon oxide, aluminum oxide, and the like. A temporary adhesive layer 202 (e.g., a glue layer, a light-to-heat conversion (LTHC) coating, an ultraviolet (UV) film, and the like) is disposed over carrier 200. Dies may be temporarily affixed to carrier 200 using a combination of adhesive layer 202 and/or an additional adhesive layer 204 (e.g., a die attach film (DAF)) disposed on a backside of dies 102.

Figure 3:
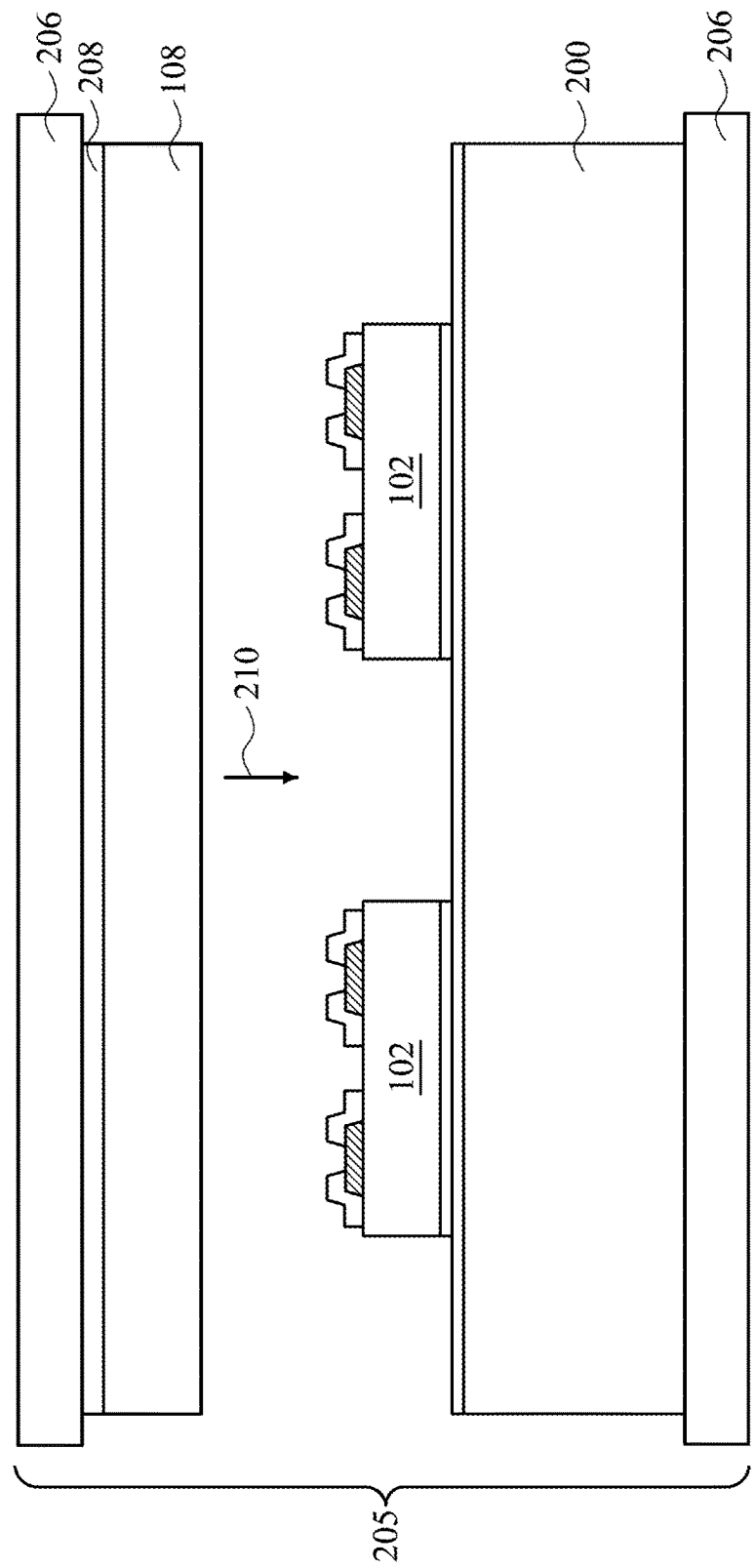
Figure 4:
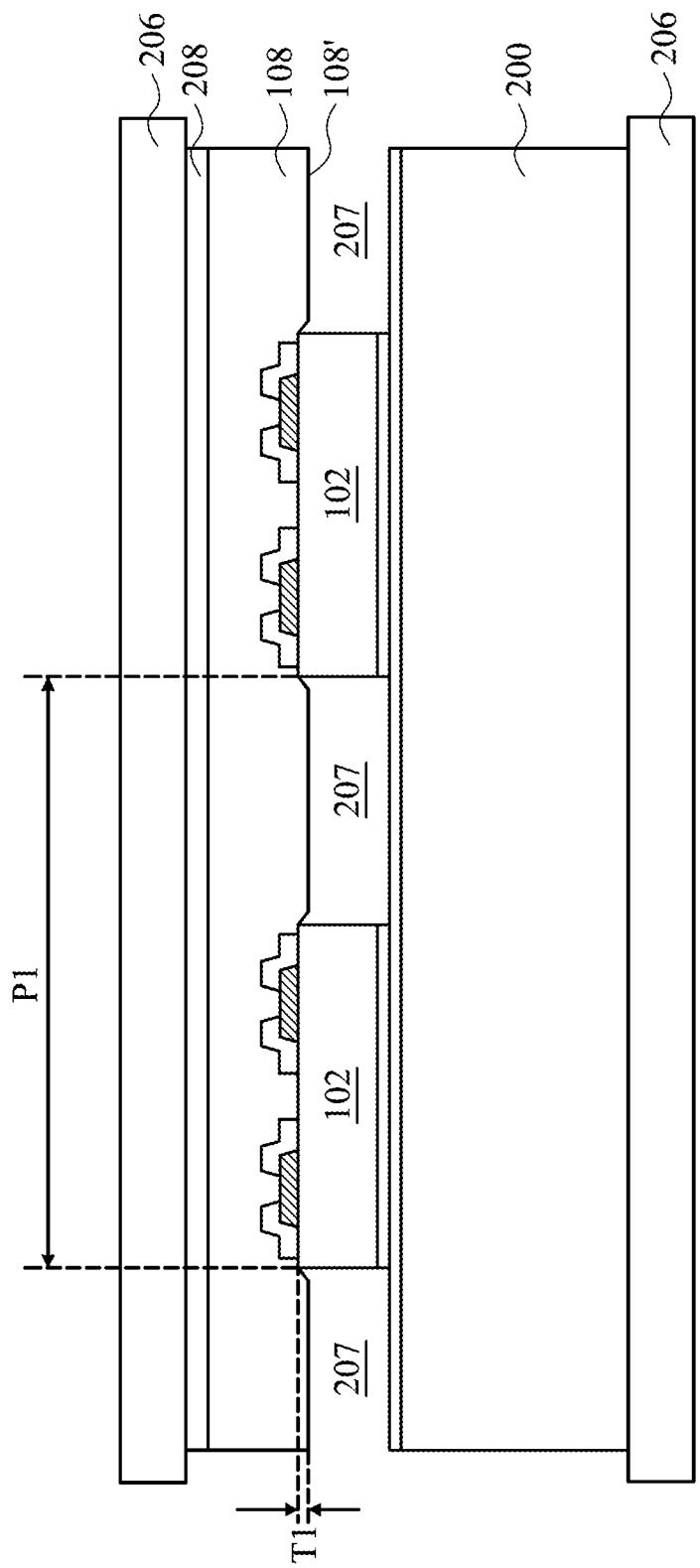

FIGS. 3 and 4 illustrate the formation of polymer layer 108 over dies 102 using a vacuum lamination process, for example. Referring first to FIG. 3, carrier 200 (having dies 102 mounted thereto) is disposed between top and bottom plates 206 of a molding apparatus 205. Top and bottom plates 206 may comprise a suitable material for providing structural support such as a metal, ceramic, or the like. A release film 208 may be disposed on a bottom surface of top plate 206, and polymer layer 108 may be disposed on a bottom surface of release film 208. In some embodiments, release film 208 comprises polyethylene terephthalate (PET), Teflon® (E. I. du Pont de Nemours and Company, Del., USA), rubber, polythylene-naphthalate (PEN), polyetherimide (PEI), silicon rubber, polyphenylene sulfide (PPS), prepreg contained glass fiber, or any other material that can temporary support polymer layer 108 and be removed from polymer layer 108 after the formation of various features.

Polymer layer 108 may be disposed on a bottom surface of release film 208 (e.g., facing dies 102). Polymer layer 108 may comprise a lamination film material, such as polyimide, PBO, epoxy, an underfill film, a molded underfill film, and the like either with or without a filler material. Polymer layer 108 may be adhered to the bottom surface of release film 208 by a relatively weak bond. For example, prior to its placement on dies 102, polymer layer 108 may be uncured or only partially cured. Subsequently, top and/or bottom plates 206 may be moved to contact a bottom surface of polymer layer 108 to top surfaces of dies 102 as indicated by arrow 210, for example.

FIG. 4 illustrates molding apparatus 205 after polymer layer 108 is disposed on top surfaces of dies 102. Polymer layer 108 may cover top surfaces of dies 102 (e.g., covering contact pads 110 and passivation layer 112). Polymer layer 108 may not extend extensively past top surfaces of dies 102. For example, gaps 207 may remain disposed between dies 102 under polymer layer 108. Furthermore, the lack of any support material under polymer layer 108 may result in a bottom surface of polymer layer 108 not being substantially level. For example, a bottom surface of polymer layer 108 (labeled 108') may have a TTV T1 of about 5 μm to about 10 μm. TTV T1 may be a variable of the spacing of dies 102 (e.g., pitch P1) and the corresponding lateral size of gaps 207. For example, in embodiments where spacing P1 is about 100 μm to about 200 μm, TTV T1 may be smaller (e.g., about 10 μm). As another example, in embodiments where pitch P1 is about 1 mm to about 2 mm, TTV T1 may be larger (e.g., about 20 μm).

After polymer layer 108 is disposed on dies 102, a curing process may be performed to adhere polymer layer 108 to top surfaces of die 102. For example, in some embodiments, polymer layer 108 may be cured at a temperature of about 25° Celsius to about 200° Celsius for about 30 second to about 10 minutes. The curing process may vary depending on the material of polymer layer 108. In various embodiments, sufficient pressure is applied (e.g., by top and/or bottom plates 206) to polymer layer 108 so that a top surface of polymer layer 108 is substantially level or at least more level than molding compound 104. Although FIG. 4 illustrates polymer layer 108 as being perfectly level, a top surface of polymer layer 108 may be non-planar (e.g., concave), particularly between dies 102 (see e.g., FIG. 1C). In an embodiment, when a spacing between dies 102 is less than about 3000 μm, a TTV of polymer layer 108 may be less than about 5 μm. In an embodiment when a spacing between dies 102 is less than about 500 μm, a TTV of polymer layer 108 may be less than about 3 μm. In an embodiment when a spacing between dies 102 is less than about 100 μm, a TTV of polymer layer 108 may be less than about 2 μm. As discussed above, it has been observed that by maintaining the TTV of polymer layer 108 with respect to die spacing within these ranges, relatively fine-pitched conductive lines may be reliably formed on polymer layer 108.

Figure 5:
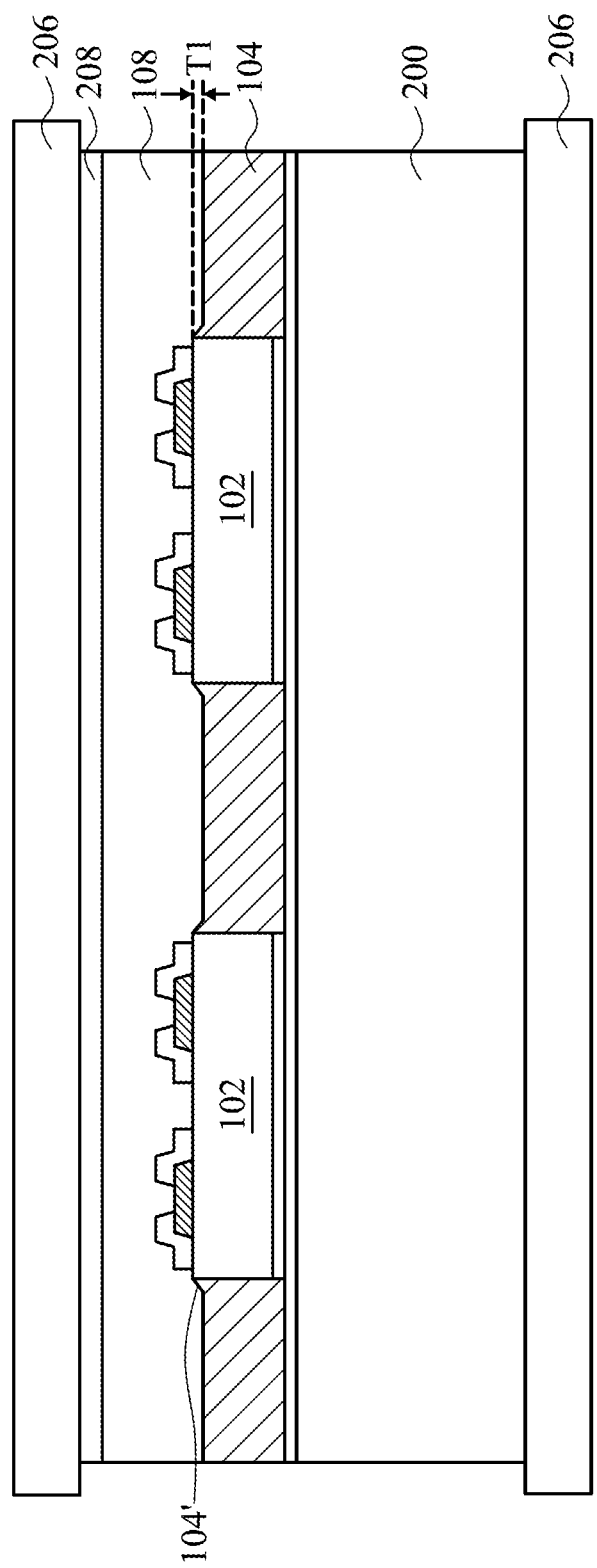

Next in FIG. 5, molding compound 104 is formed in gaps 207 using a transfer molding process, for example. Polymer layer 108 may be used as a film layer that covers top surfaces of dies 102 (e.g., covering contact pads 110 and passivation layer 112) during the molding process. Molding compound 104 comprises a suitable material such as an epoxy resin, a molding underfill, and the like. In some embodiments, the transfer molding process includes dispensing molding compound 104 between dies 102 (e.g., in gaps 207) in liquid form. Next, a curing process may be performed to solidify molding compound 104. A top surface of molding compound 104 may contact the bottom surface of polymer layer 108, and thus a top surface of molding compound 104 may have a similar profile as the bottom surface of polymer layer 108. For example, a top surface of molding compound 104 may include an inclined, recessed surface 104' against sidewalls of dies 102. Other portions of the top surface of molding compound 104 may include similar variations in angle and/or height. In various embodiments, a TTV T1 of a top surface of molding compound 104 (and corresponding bottom surface of polymer layer 108) may be about 5 μm to about 30 μm. Thus, molding compound 104 and polymer layer 108 may be formed in package 100 using lamination and transfer molding processes.

FIGS. 2 through 5 illustrate the formation of polymer layer 108 prior to molding compound 104 in accordance with some embodiments. In alternative embodiments, an alternative order of forming various elements in package 100 may be employed. For example, FIGS. 6 to 8 illustrate forming polymer layer 108 after molding compound 104.

Figure 6:
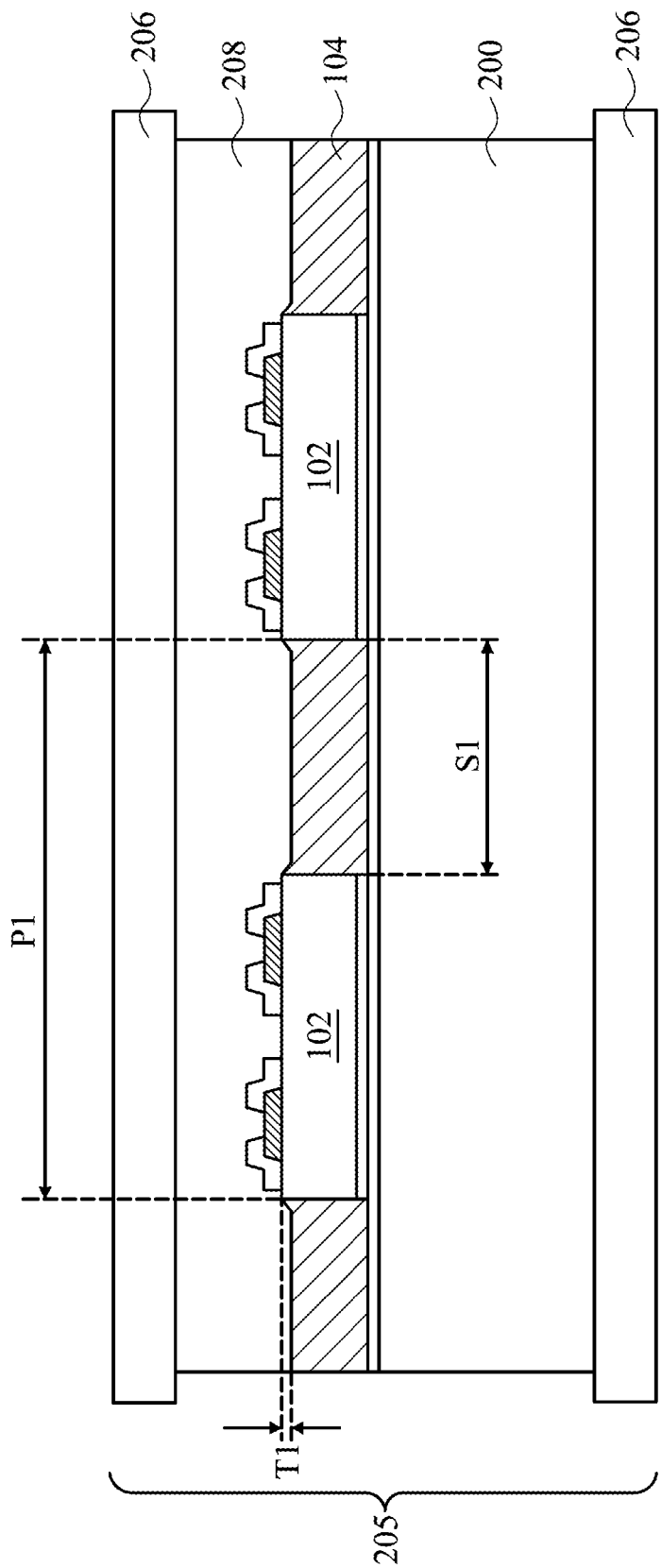

In FIG. 6, molding compound 104 is dispensed around between dies 102 prior to the formation of polymer layer 108. For example, dies 102 (supported by carrier 200) may be placed on bottom plate 206 of a molding apparatus 205 and release film 208 (e.g., supported by top plate 206) may be used to cover top surfaces of dies 102 during transfer molding. Molding compound 104 may be dispensed in liquid form between dies 102 and then cured. As a result of the transfer molding process, a top surface of molding compound 104 may not be substantially level (e.g., having a TTV T1 of about 5 μm to about 30 μm) and may have inclined and/or recessed portions 104', for example. TTV T1 may vary depending on the spacing P1 of dies 102.

Figure 7:
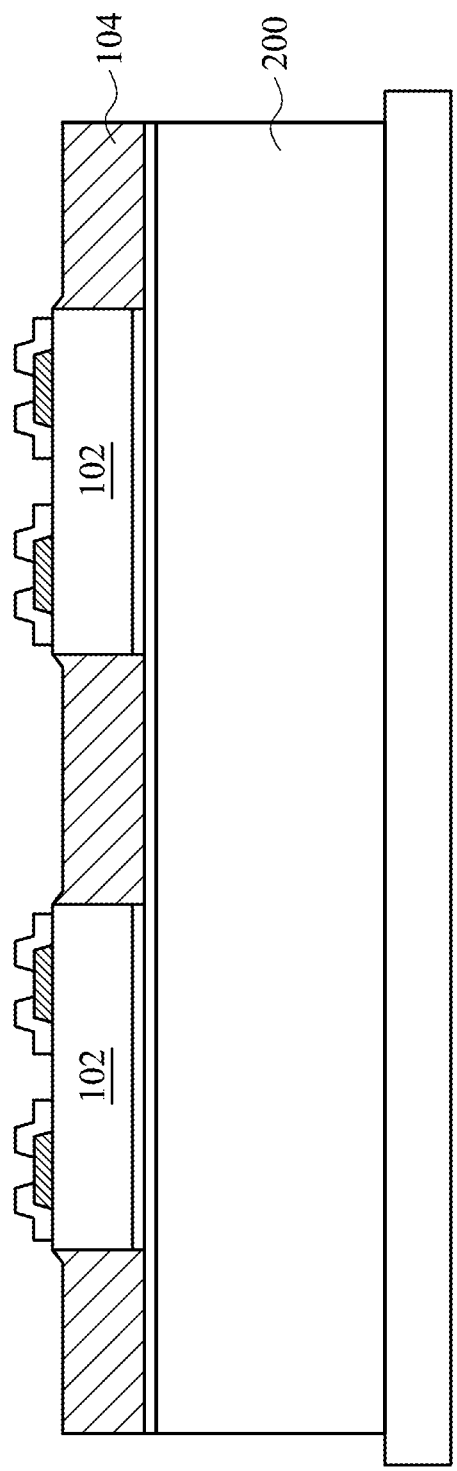

Next, as illustrated by FIG. 7, top and bottom plates 206 as well as release film 208 are removed from dies 102 and carrier 200. For example, release film 208 may comprise a material that has a relatively weak adhesive bond with molding compound 104, and release film 208 (and attached top plate 206) may be removed using mechanical force. For example, release film 208 may comprise polyethylene terephthalate (PET), teflon, rubber, polyethylene-naphthalate (PEN), polyetherimide (PEI), silicon rubber, polyphenylene Sulfide (PPS), prepreg contained glass fiber, and the like. Due to the placement of release film 208, molding compound 104 may be formed around dies 102 without covering a top surface of dies 102. Thus, additional process (e.g., grinding) need not be performed to expose features of dies 102 (e.g., contact pads 110), thereby saving process costs.

Figure 8:
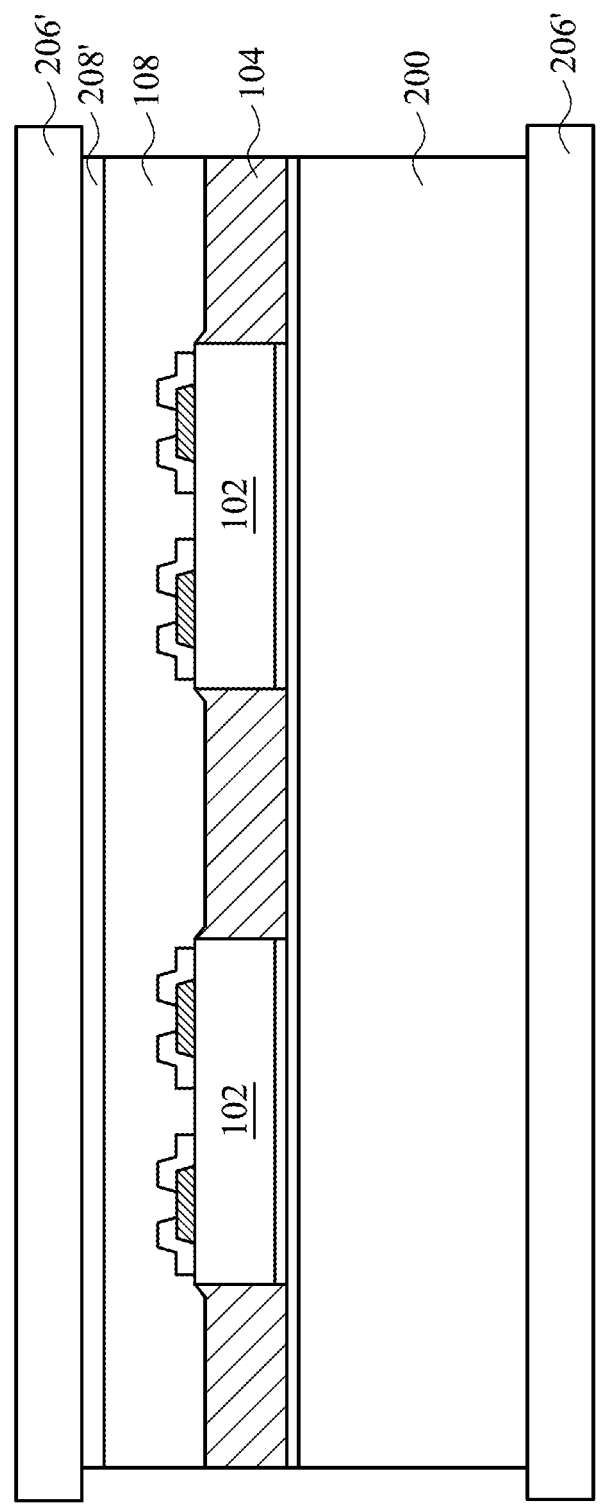

In FIG. 8, polymer layer 108 is formed over dies 102 and molding compound 104 using a suitable lamination process. For example, dies 102 (supported by carrier 200) may be placed between top and bottom plates 206'. Top and bottom plates 206' may be the same supports as top/bottom plates 206 of molding apparatus 205, or top and bottom plates 206' may be features of another processing apparatus (e.g., a lamination tool). Top and bottom plates 206' may be used to place a polymer layer 108 over dies 102 and molding compound 104. A release film 208' may be disposed between polymer layer 108 and top plate 206'. Alternatively, a heat roll lamination process (e.g., involving a rolling apparatus, not shown) may be used to roll polymer layer 108 on dies 102 and molding compound 104. In yet another embodiment, polymer layer 108 may be formed using any suitable process, such as chemical vapor deposition, or the like.

After polymer layer 108 is disposed on dies 102/molding compound 104, a curing process may be performed to adhere polymer layer 108 to top surfaces of die 102 and molding compound 104. For example, polymer layer 108 may be cured at a temperature of about 25° Celsius to about 200° Celsius for about 30 second to about 10 minutes. A planarization process, such as pressure clamping (e.g., by applying a suitable amount of pressure using top and/or bottom plates 206') is applied to polymer layer 108 to level a top surface of polymer layer 108. For example, after pressure clamping, the top surface of polymer layer 108 may have a TTV less than about 3 μm, which may be a suitable TTV for reliably forming additional RDL features (e.g., fine pitched conductive features and/or additional polymer layers) over polymer layer 108. Furthermore, in some embodiments, a high temperature film (e.g., a high temperature PBO film, not shown) may optionally be disposed over polymer layer 108, cured, and planarized (e.g., using a pressure clamping process). The pressure clamping process may be applied to the high temperature film when the high temperature film is partially cured (e.g., about 10% to about 80%) cured.

Figure 9:
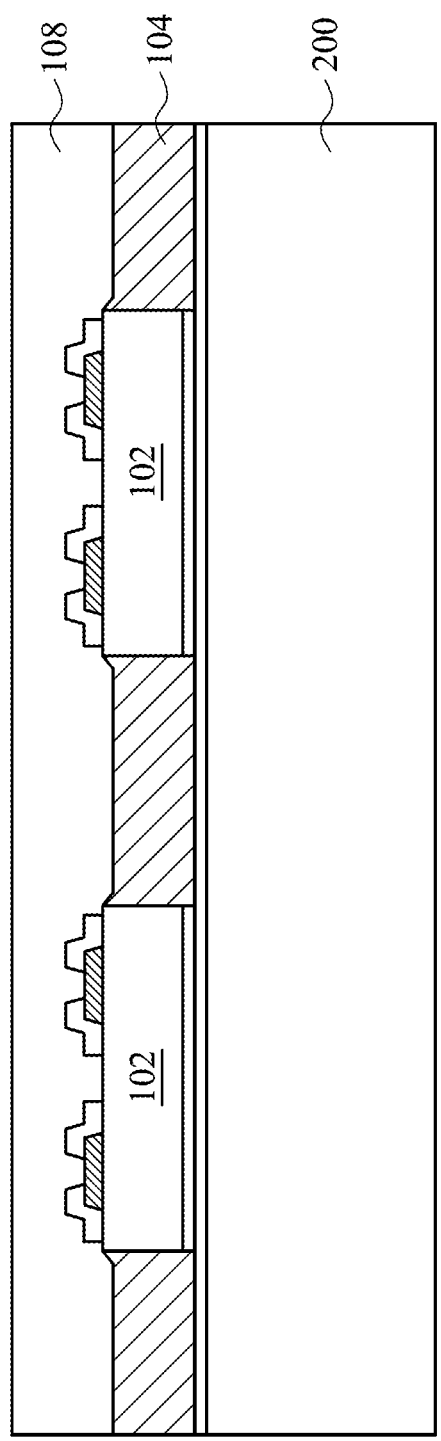
Figure 10:
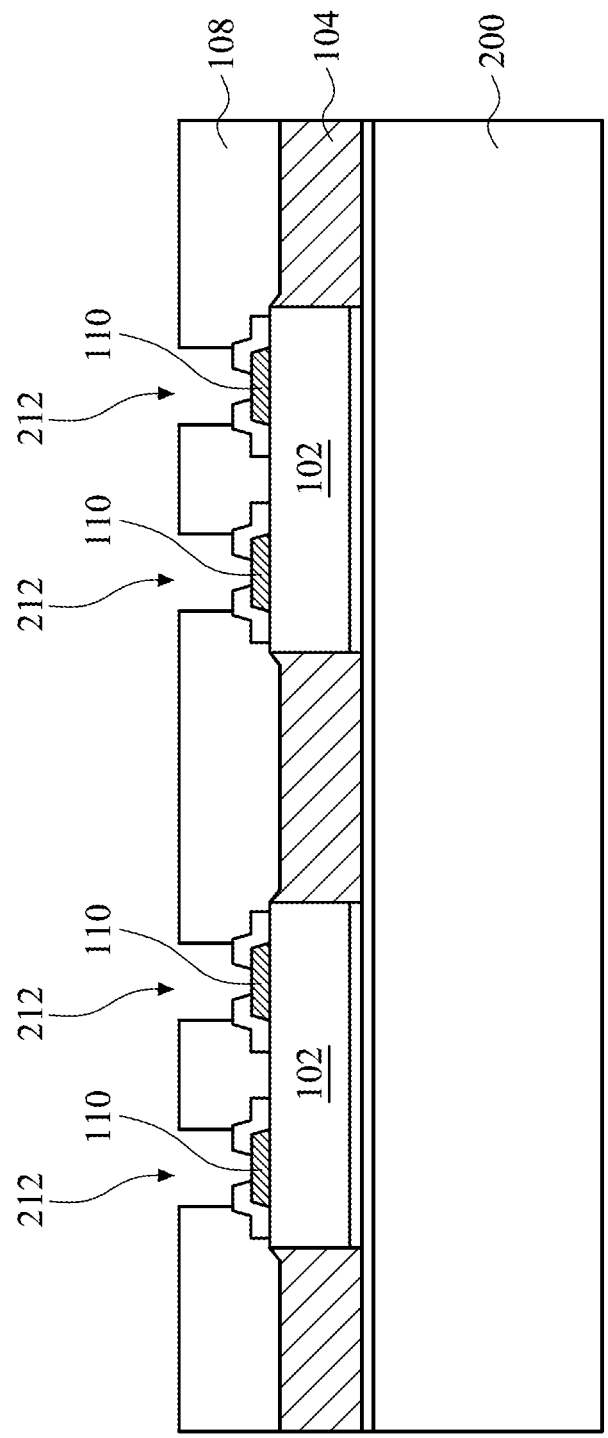

In FIG. 9, dies 102 having molding compound 104 and polymer layer 108 formed thereon are removed from top and bottom plate 206. Release film 208 may aid in the removal of top and bottom plates 206 using mechanical force. For example, release film 208 may comprise a material (e.g., polyethylene terephthalate (PET), teflon, rubber, polyethylene-naphthalate (PEN), polyetherimide (PEI), silicon rubber, polyphenylene Sulfide (PPS), prepreg contained glass fiber, and the like) that does not have high adhesion with polymer layer 108, and release film 208 may be removed using mechanical force without damaging other features of the device package. Next in FIG. 10, openings 212 are formed in polymer layer 108 to expose contact pads 110 using any suitable process, such as photolithography, laser drilling, and/or etching techniques, for example.

Figure 11:
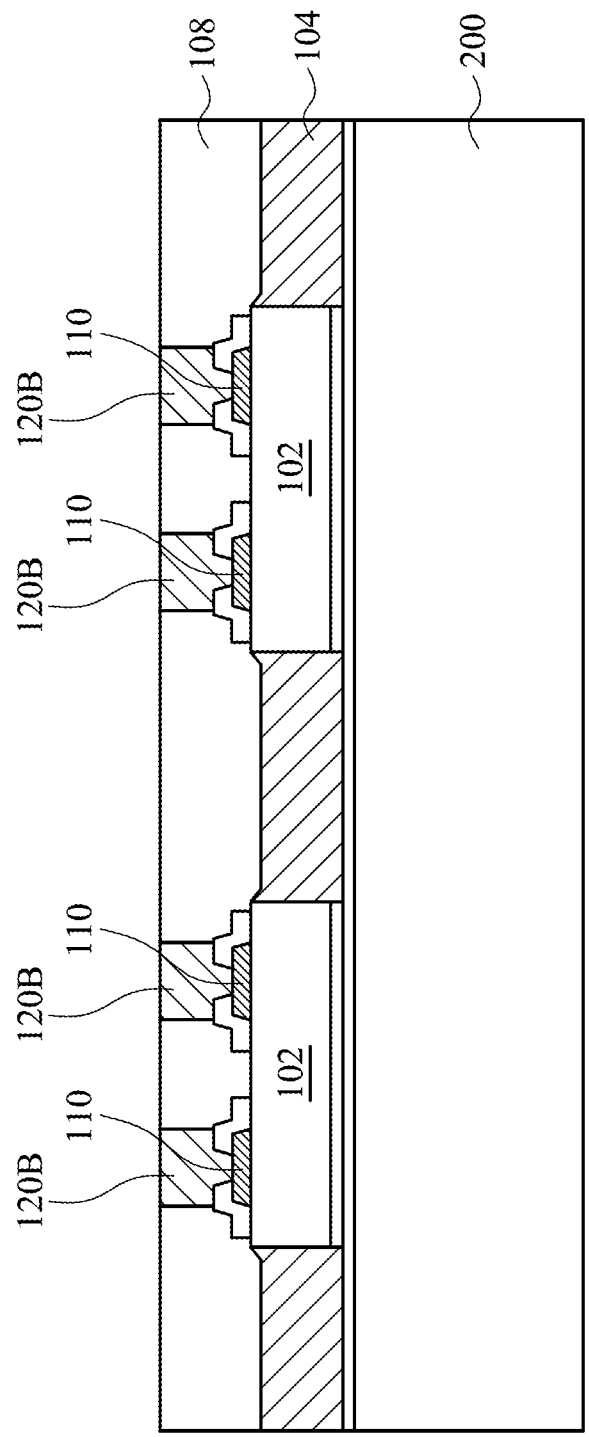
Figure 12:
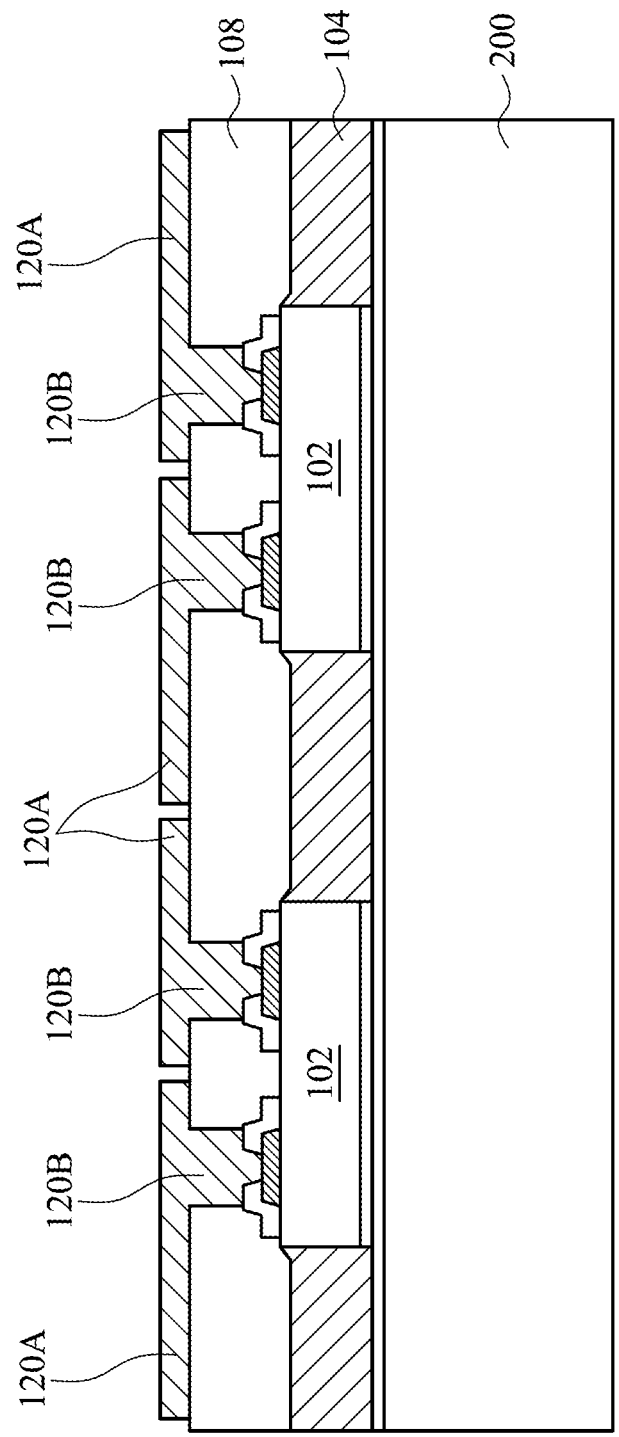

FIGS. 11 and 12 illustrate the formation of various conductive features 120, such as conductive vias 120B and conductive lines 120A. First, in FIG. 11, openings 212 are filled with a conductive material (e.g., copper, silver, gold, and the like) to form conductive vias 120B. The filling of openings 212 may include first depositing a seed layer (not shown) and electro-chemically plating openings 212 with the conductive material. The conductive material may overfill openings 212, and a chemical mechanical polish (CMP) or other etch back technique may be performed to remove excess portions of the conductive material over polymer layer 108. Conductive vias 120B may electrically connect to contact pads 110 of dies 102.

Next, in FIG. 12, conductive lines 120A (e.g., comprising copper, silver, gold, and the like) are formed over polymer layer 108. The formation of conductive lines 120A may include depositing a seed layer (not shown), using a mask layer (not shown) having various openings to define the shape of conductive lines 120A, and filling the openings in the mask layer using an electro-chemical plating process, for example. The mask layer may then be removed. Although conductive lines 120A is illustrated as having perfectly level top surfaces, in an embodiment, a top surface of conductive lines 120A may be non-planar (e.g., concave) over non-planar portions of polymer layer 108 and molding compound 104 (see e.g., FIG. 1C). In an embodiment, a width of conductive lines 120A may be less than about 10 μm, and a spacing between adjacent conductive lines 120A may be less than 10 μm.

Figure 13:
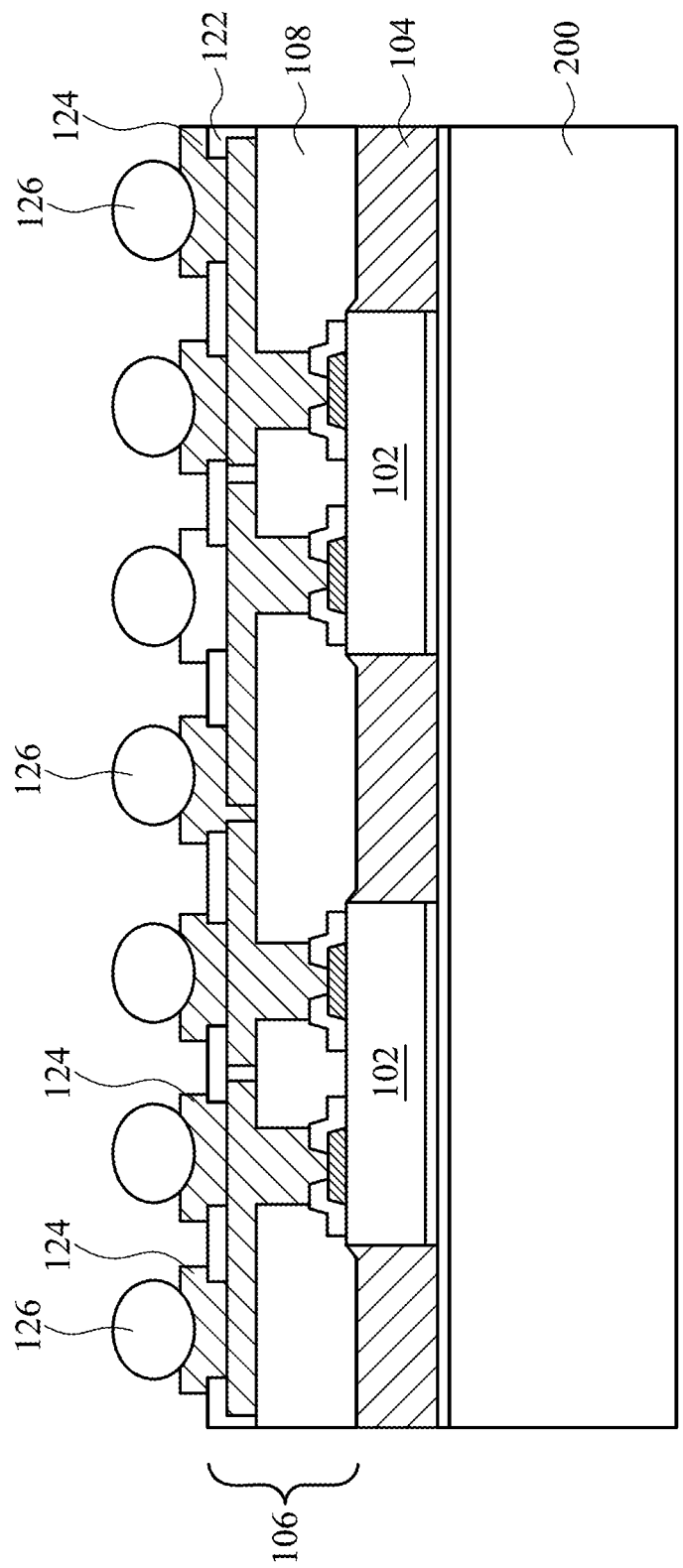

Additional features may be formed over polymer layer 108 and conductive features 120. For example, FIG. 13 illustrates the formation of another polymer layer 122 over polymer layer 108 and conductive features 120. Polymer layer 122 may be formed using any suitable process such as lamination, a spin-on process, and the like. Thus, RDLs 106 are formed over dies 102 and molding compound 104. The number of polymer layers and conductive features of RDLs 106 is not limited to the illustrated embodiment of FIG. 13. For example, RDLs 106 may include any number of stacked, electrically connected conductive features in multiple polymer layers.

As further illustrated by FIG. 13, additional package features, such as external connectors 126 (e.g., BGA balls, C4 bumps, and the like) may be formed over RDLs 106. Connectors 126 may be disposed on UBMs 124, which may also be formed over RDLs 106. Connectors 126 may be electrically connected to one or more dies 102 by way of RDLs 106. Connectors 126 may be used to electrically connect dies 102 to other package components such as another device die, interposers, package substrates, printed circuit boards, a mother board, and the like. Subsequently, carrier 200 may be removed and dies 102 (including corresponding portions of RDLs 106, UBMs 124, and connectors 126) may be singulated along scribe lines using a suitable die saw technique. After singulation, each device package may include a single die or multiple dies depending on package configuration.

Figure 14:
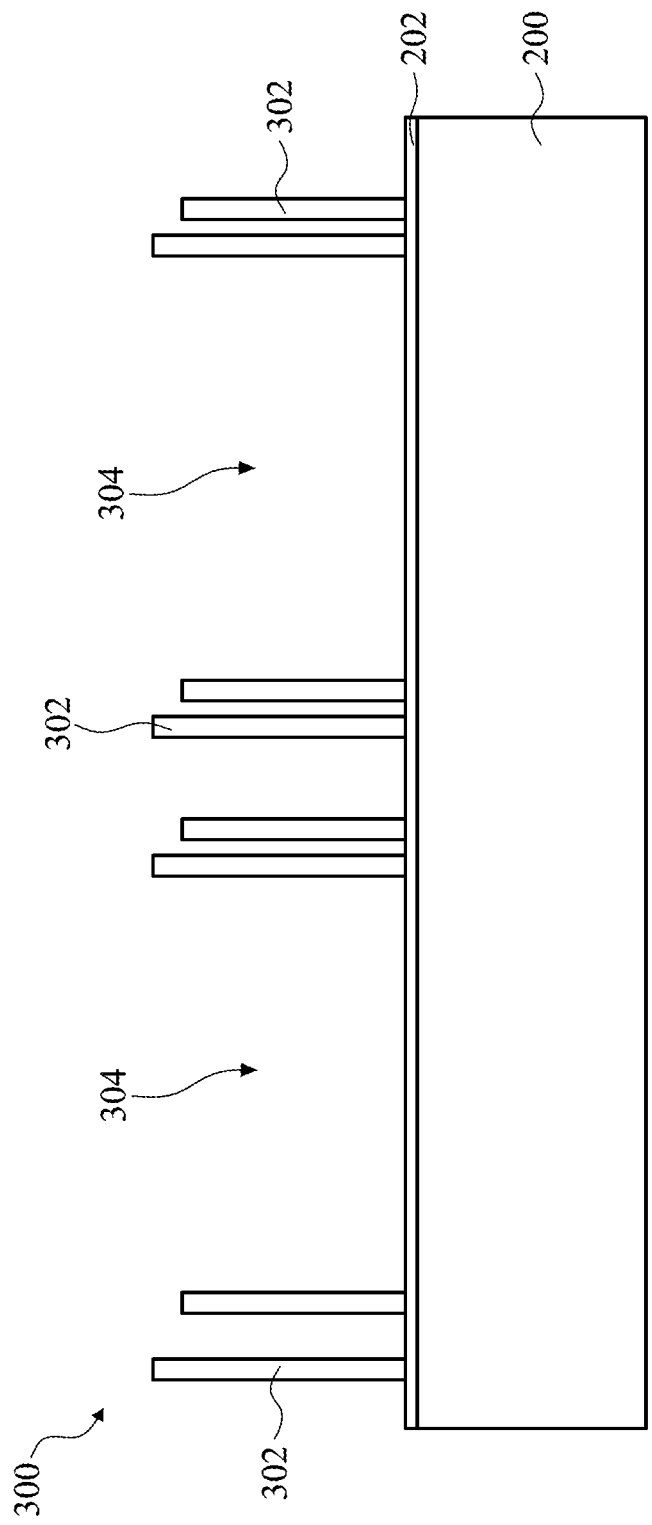
FIGS. 14 through 20 illustrate cross-sectional views of intermediary steps of manufacturing a device package in accordance with some other embodiments.

FIGS. 14 through 20 illustrate cross-sectional views of various intermediary steps of manufacturing a device package having through intervias extending through a molding compound in accordance with some alternative embodiments. In FIG. 14, various through intervias 302 are formed over a carrier substrate 200 (e.g., on adhesive layer 202). Through intervias 302 may comprise copper, nickel, silver, gold, and the like for example, and may be formed by any suitable process. For example, a seed layer (not shown) may be formed over carrier 200, and a patterned photoresist (not shown) having openings may be used to define the shape of through intervias 302. The openings may expose the seed layer, and the openings may be filled with a conductive material (e.g., in an electro-chemical plating process). Subsequently, the photoresist may be removed in an ashing and/or wet strip process, leaving through intervias 302 on carrier 200. Through intervias 302 can also be formed using copper wire stud by copper wire bond processes (e.g., where mask, photoresist, and copper plating are not required). Top surfaces of through intervias 302 may or may not be substantially level. Openings 304 may be disposed between adjacent groups of through intervias 302, and openings 304 may have sufficiently large dimensions to dispose a die 102 therein (see e.g., FIG. 15).

Figure 15:
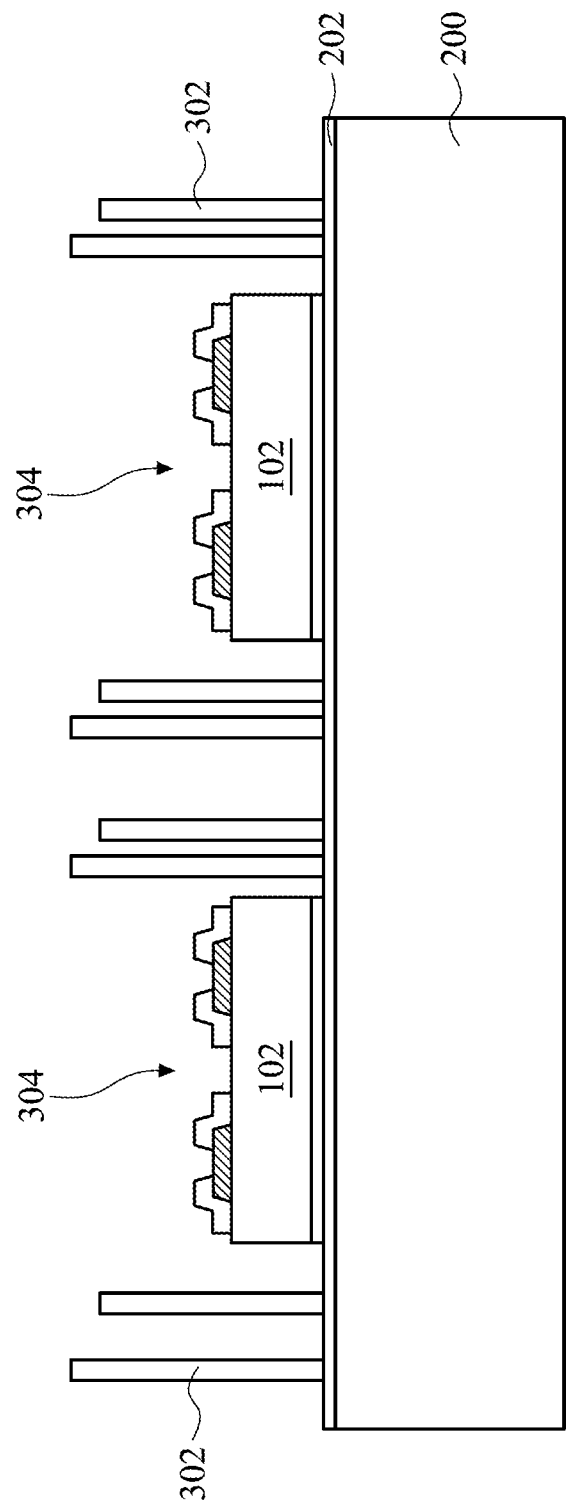
Figure 16:
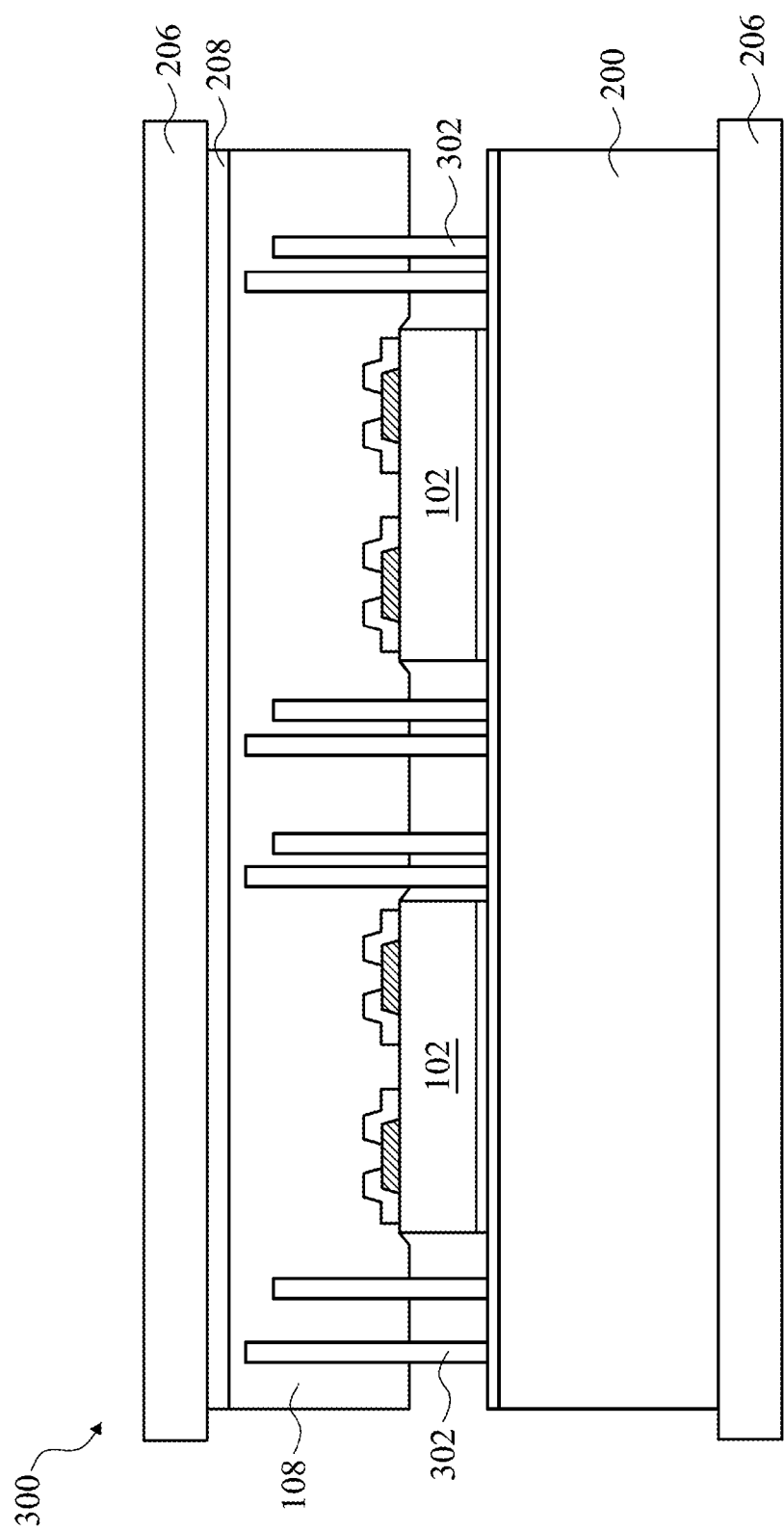
Figure 17:
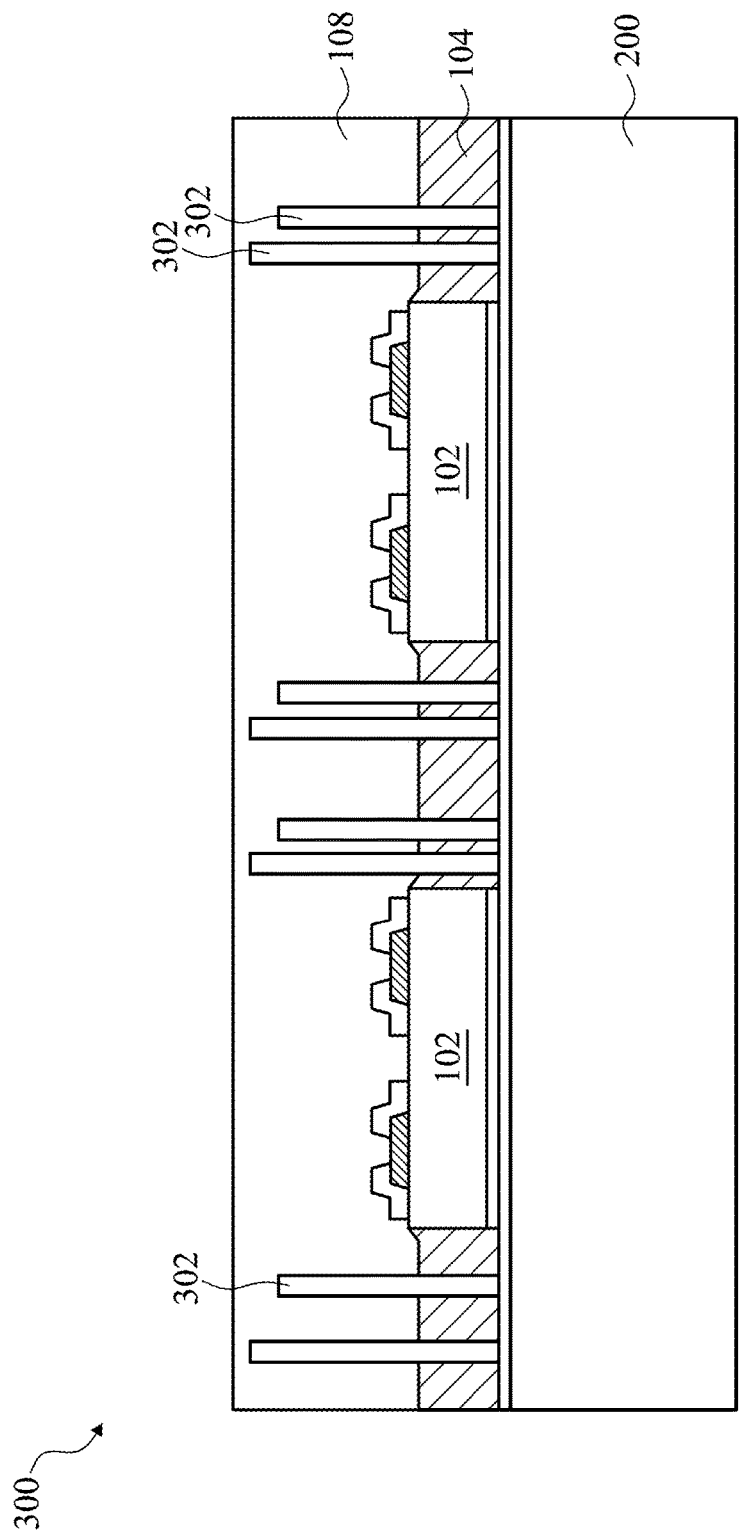

Next in FIG. 15, dies 102 are placed in openings 304 between through intervias 302. Though vias 302 may have a top surface that is higher than a top surface of dies 102. FIGS. 16 and 17 illustrate the formation of molding compound 104 around dies 102 and polymer layer 108 over dies 102. Polymer layer 108 may be thick enough to over top surfaces of through intervias 302. Polymer layer 108 and molding compound 104 may be formed using lamination and transfer molding techniques such as the methods described by FIGS. 2 through 5 (e.g., where polymer layer 108 is formed prior to molding compound 104) or FIGS. 6 through 8, for example (e.g., where polymer layer 108 is formed after molding compound 104). The formation of polymer layer 108 may further include a pressure clamping process (e.g., using top and/or bottom plates 206) to planarize a top surface of polymer layer 108.

Figure 18:
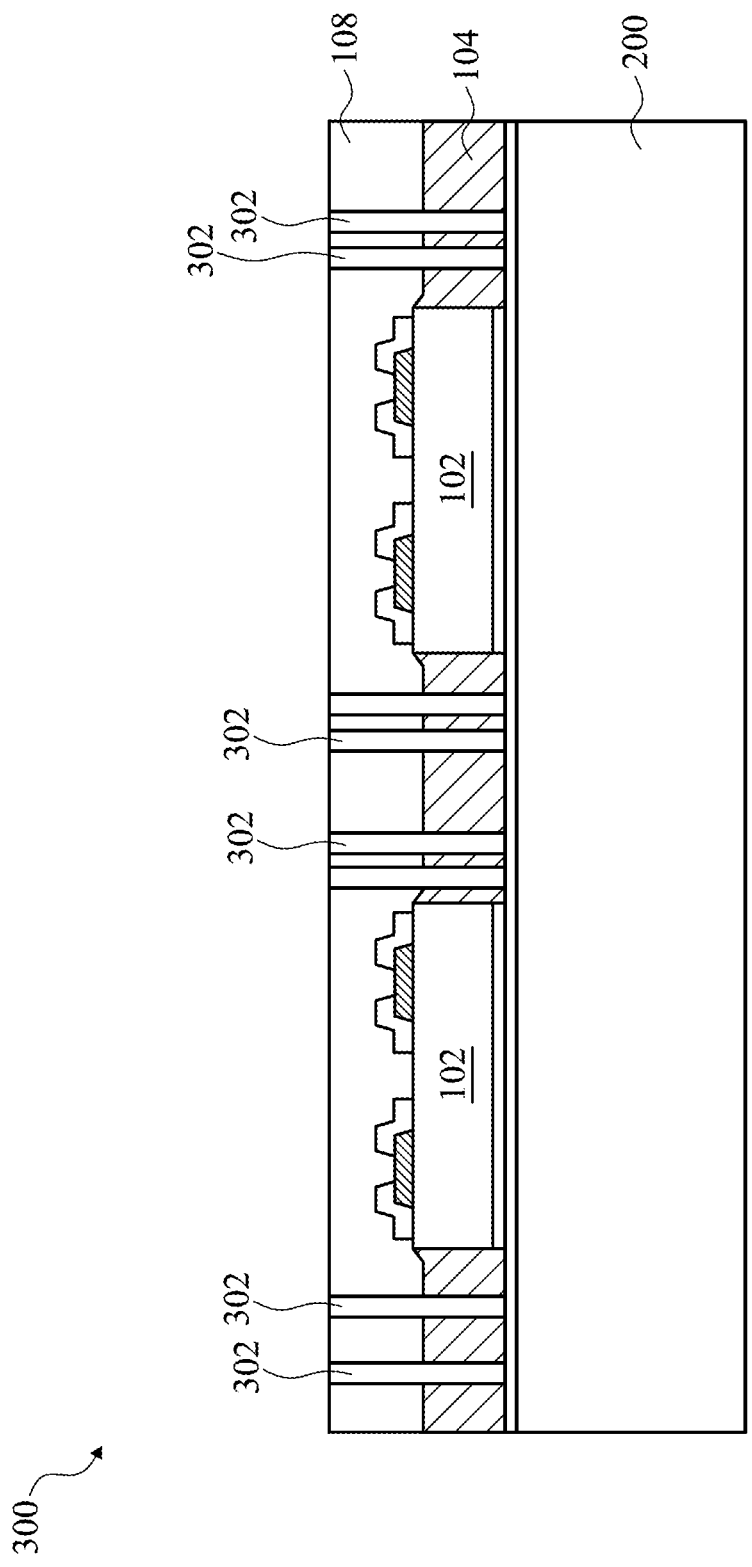
Figure 19:
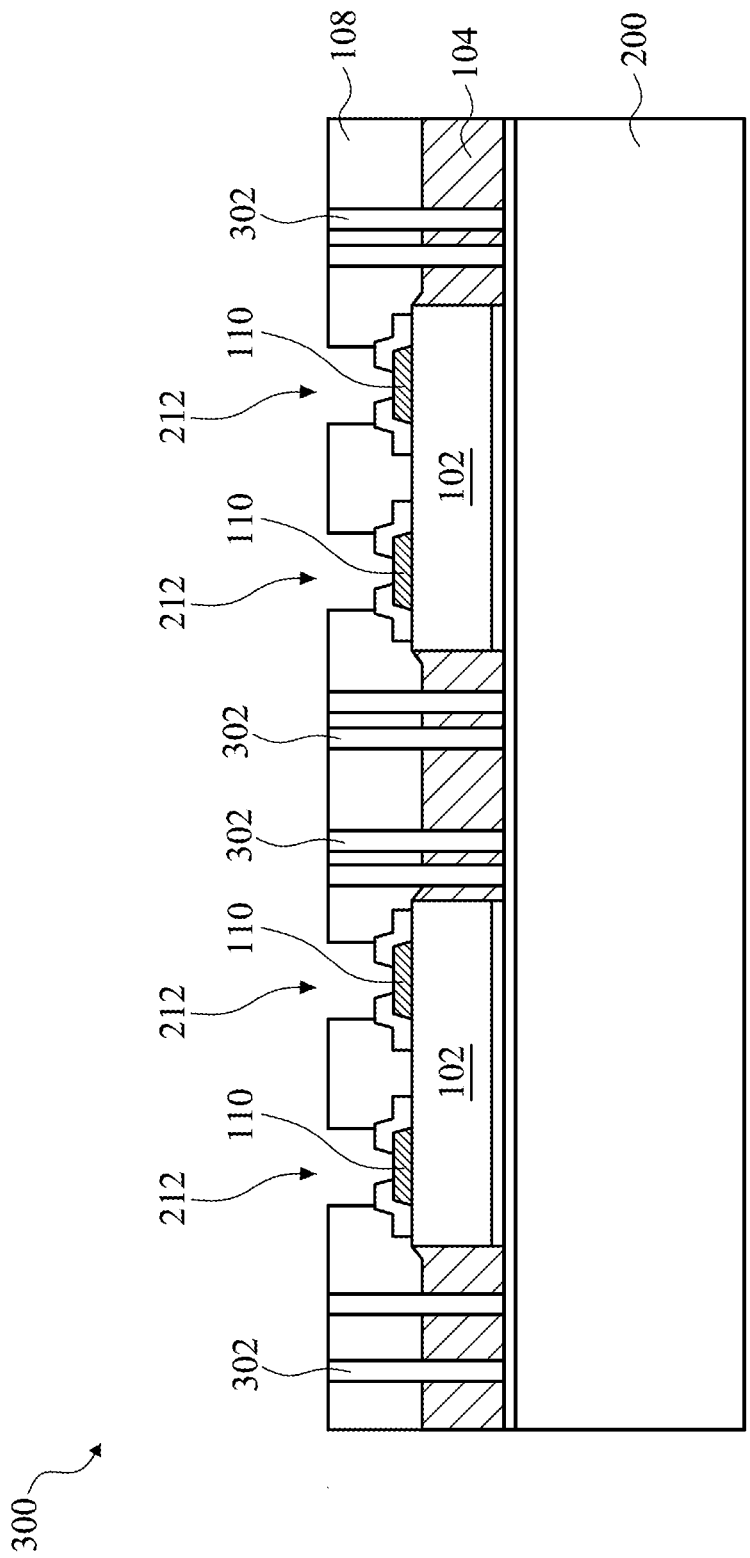

In FIG. 18, a thinning process may be performed on polymer layer 108 to expose through intervias 306. For example, a grinding, CMP, fly cutting process, or other etch back technique may be applied to the top surface of polymer layer 108 to expose through intervias 306. In FIG. 19, openings 212 are patterned (e.g., through laser drilling, photolithography, and/or etching techniques) in polymer layer 108 to expose contact pads 110 of dies 102. The resulting polymer layer 108 may include a top surface having TTV that is less than a TTV of a top surface of molding compound 104. For example, a TTV of polymer layer 108 may be less than about 3 μm to provide a suitable surface for the subsequent formation of fine pitched conductive lines on polymer layer 108.

Figure 20:
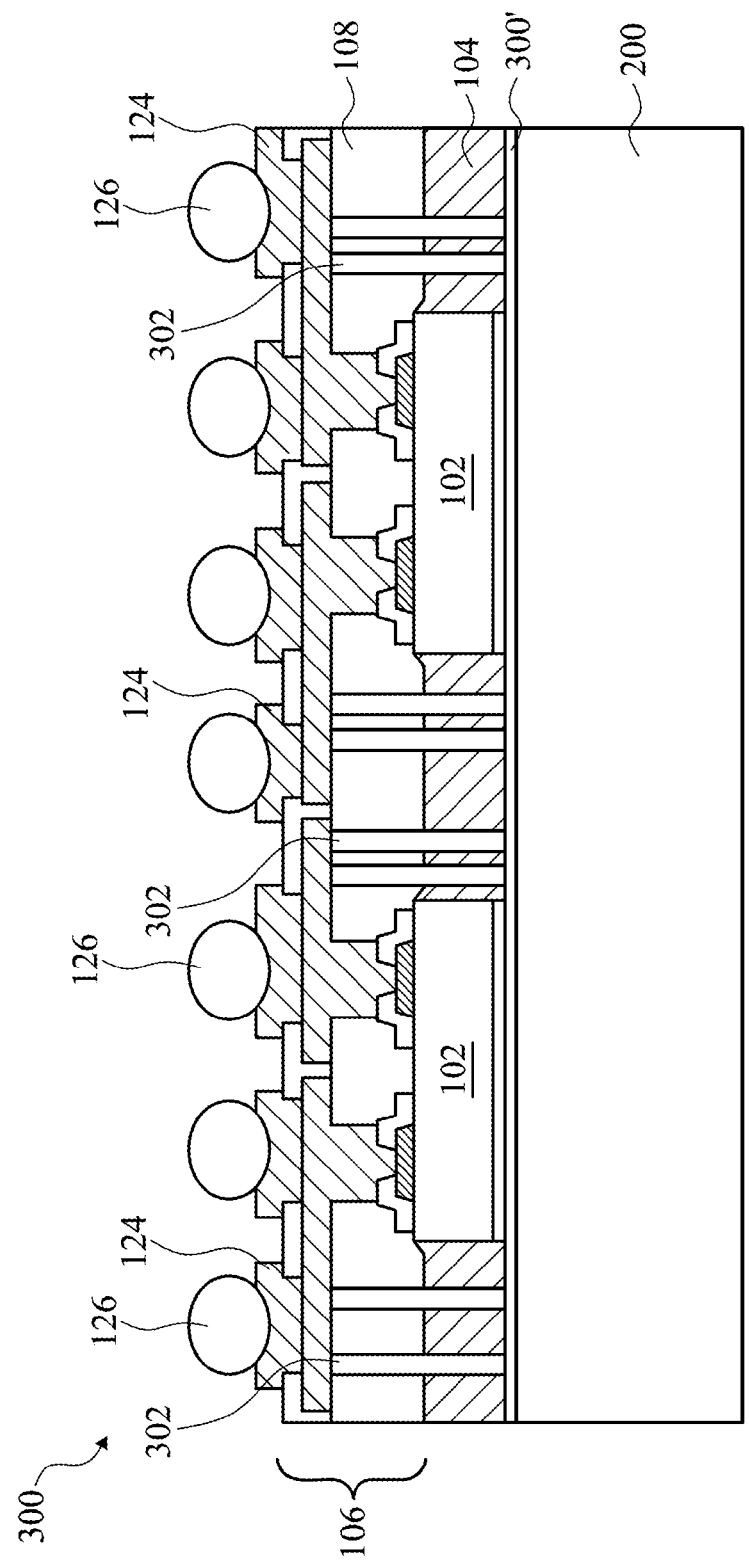

Subsequently, in FIG. 20, other features of RDLs 106 are formed over polymer layer 108. For example, conductive features 120 and additional polymer layer(s) 122 are formed over polymer layer 108. As further illustrated by FIG. 20, additional package features, such as external connectors 126 (e.g., BGA balls, C4 bumps, and the like) on UBMs 124 may be formed over RDLs 106. Connectors 126 may be electrically connected to one or more dies 102 and/or through intervias 302 by RDLs 106. Subsequently, carrier 200 may be removed and dies 102 (including corresponding through intervias 302 and portions of RDLs 106, UBMs 124, and connectors 126) may be singulated along scribe lines using a suitable die saw technique. In some embodiments, additional features (e.g., additional RDLs, connectors, heat dissipation features, and the like) may be formed on a backside (e.g., side 300') of package 100, and through intervias 302 may be used to provide electrical connection between front side RDLs 106 and such features on the backside of package 300. Thus, a device package 300 having through intervias extending through molding compound 104 is formed using transfer molding and lamination processes.

Figure 21A:
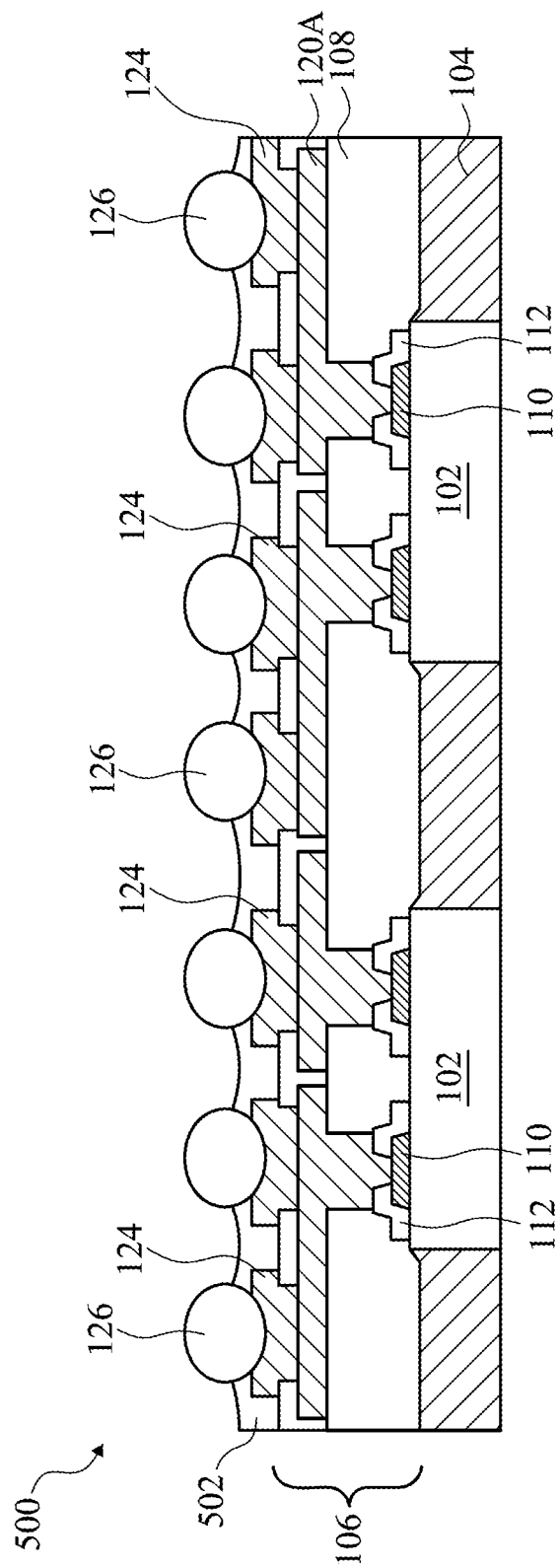
FIGS. 21A and 21B illustrate cross-sectional views of a device package in accordance with some alternative embodiments.
Figure 21B:
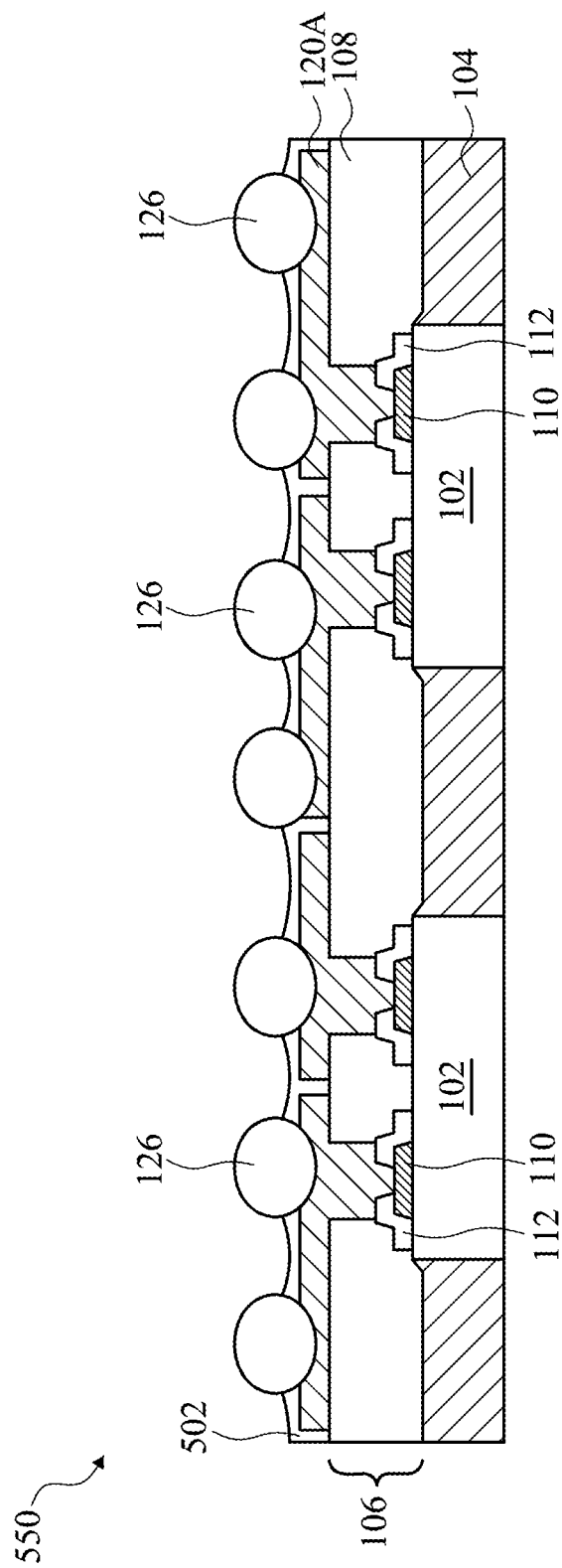

FIGS. 21A and 21B illustrate cross-sectional views of a device package 500 and 550, respectively, according to an alternative embodiment. Packages 500 and 550 may be substantially similar to package 100 where like reference numerals indicate like elements. For example, a molding compound 104 may be formed around dies 102 using a transfer molding process as described above, and RDLs 106 having a first polymer layer 108 may be formed over molding compound 104. The formation process for polymer layer 108 may result in polymer layer 108 having a substantially planar top surface (e.g., as a result of a lamination process including pressure clamping). Alternatively, polymer layer 108 may have a non-planar top surface with a TTV less than a TTV of a top surface of molding compound 104. RDLs 106 may further include various conductive features 120 (e.g., conductive vias 120B and conductive lines 120A) that are electrically connect to dies 102, and external connectors 126 may be formed over and electrically connect to such conductive features 120. FIG. 21A illustrates an embodiment where UBMs 124 are formed also over conductive features 120 and connectors 126 are disposed on UBMs 124. In some embodiments, one or more additional passivation layers (not shown) may also be formed over RDLs 106 with some of these additional passivation layers optionally covering edges of UBMs 124. Alternatively, as illustrated by FIG. 21B, UBMs 124 may be omitted, and connectors 126 may be disposed directly on conductive lines 120A in RDLs 106.

As further included in packages 500 and 550, a molded underfill 502 may be formed around connectors 126 to provide structural support to connectors 126 and/or protection to underlying device layers (e.g., RDLs 106). In some embodiments, molded underfill 502 is formed using substantially similar processes as molding compound 104. For example, molded underfill 502 may be formed using a transfer molding process as described above prior to the attachment of connectors 126. As a result, a top surface of molded underfill 502 may be non-planar. Subsequently, molded underfill 502 may be patterned (e.g., using photolithography, laser drilling, and/or etching techniques) to expose underlying UBMs 124 (e.g., as illustrated by FIG. 21A) or conductive lines 120A (e.g., as illustrated by FIG. 21B), and connectors 126 may be placed on such conductive features.

Figure 22:
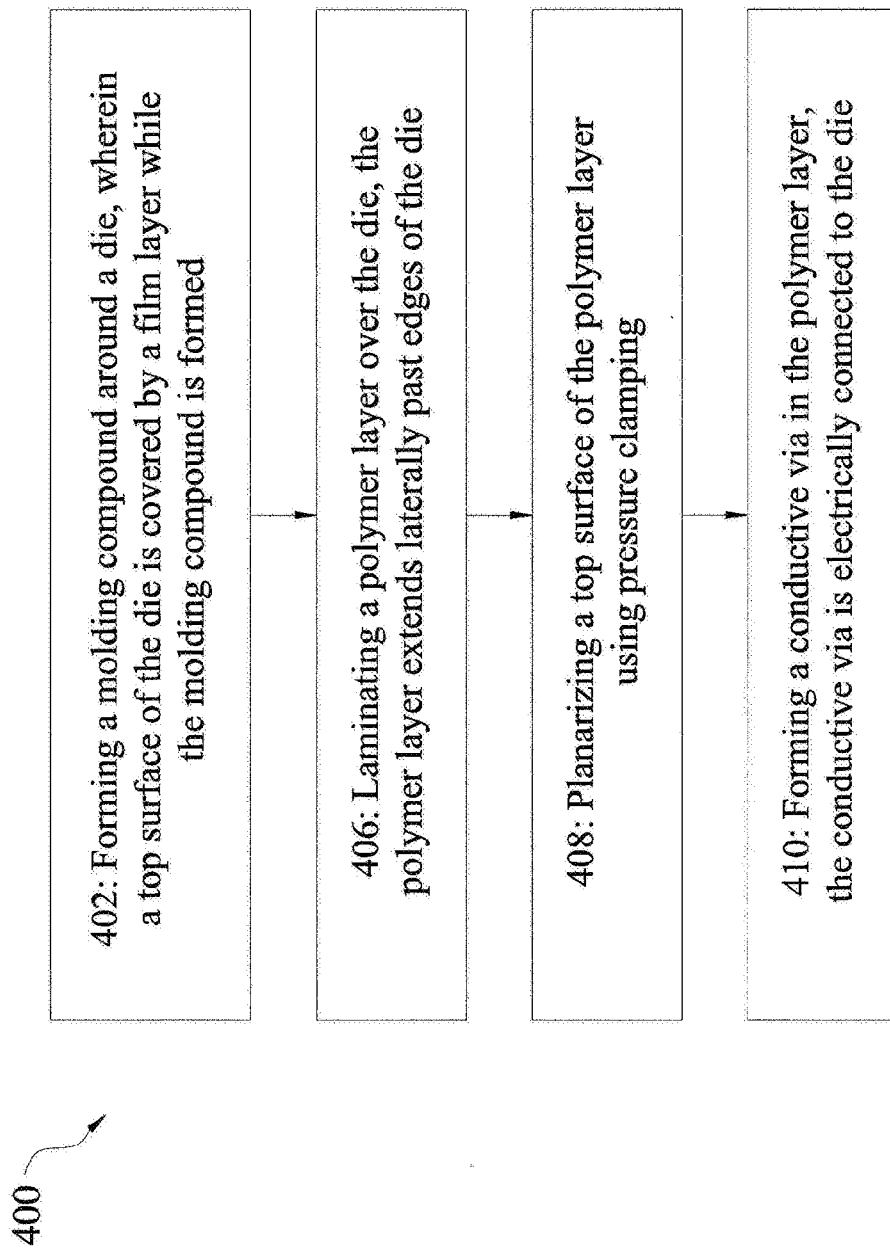
FIG. 22 illustrates a process flow for forming a device package in accordance with some embodiments.

FIG. 22 illustrates a process flow 400 for forming a device package in accordance with various embodiments. In step 402, a molding compound (e.g., molding compound 104) is formed around a die (e.g., die 102) using transfer molding processes, for example. The molding compound may not extend over or cover a top surface of the die. For example, a top surface of the die may be covered by a film layer (e.g., lamination film layer or a release film layer) while the molding compound is formed. In step 406, a polymer layer (e.g., polymer layer 108) is laminated over top surfaces of the die. The polymer layer may extend laterally past edges of the die. In some embodiments, the polymer layer formed prior to the molding compound (step 402), and the polymer layer may be used as the film layer covering top surfaces of the die during molding. In other embodiments, the polymer layer is formed after the molding compound, and the film layer used during molding is a release film layer, which is removed prior to the formation of the polymer layer.

In step 408, a top surface of the polymer layer is planarized through pressure clamping. For example, the pressure clamping by a molding apparatus or by a separate lamination apparatus. In some embodiments, pressure clamping may be performed during the lamination process (e.g., during a curing process for adhering the polymer to top surfaces of the die). Alternatively or additionally, pressure clamping may be performed separately from lamination. Next, in step 410, a conductive via (e.g., via 120B) is formed in the polymer layer, the conductive via is electrically connected to the die (e.g., electrically connected to a contact pad 110 in die 102). Other features such as additional polymer layers, conductive features (e.g., conductive lines, conductive vias, and/or through intervias extending through the molding compound), UBMs, external connectors, and the like and the like may also be formed.

A method for forming a fan-out device package and corresponding structure are disclosed. In some embodiments, a molding compound is formed around a die using a transfer molding process where a top surface of the die is covered by a film layer during the molding process. The molding compound may not be formed to cover a top surface of the die, and a grinding process (or other etch back technique) need not be performed on the molding compound to expose the die, simplifying the molding process and reducing manufacturing cost. Due to the transfer molding process, a top surface of the molding compound may have a TTV of about 5 μm to about 30 μm.

A first RDL, such as a polymer layer (e.g., a lamination film material), is formed over the molding compound and the die using a lamination process (e.g., vacuum lamination, heat roll lamination, or the like). In some embodiments, the polymer layer is used as the film layer during molding. Alternatively, the polymer layer may be formed after the molding compound. The lamination process may further include pressure clamping to provide a substantially planar top surface for the polymer layer suitable for forming various fan-out structures (e.g., conductive lines) over the die. A bottom surface of the polymer layer contacting the molding compound may have a corresponding profile and TTV as the molding compound. Thus, a fan-out device package may be formed using transfer molding and lamination processes, which may reduce overall costs of manufacturing the package.

In accordance with a representative embodiment, a method of forming a device package includes the steps of: disposing a plurality of dies on a carrier; forming a molding compound over the carrier and around the plurality of dies, the molding compound comprising a non-planar top surface between adjacent dies of the plurality of dies; forming a film layer covering the plurality of dies while forming the molding compound; forming a polymer layer over the plurality of dies and contacting the non-planar top surface of the molding compound; planarizing a top surface of the polymer layer to have a total thickness variation (TTV) less than a TTV of the non-planar top surface of the molding compound; and forming a conductive line on the polymer layer. The top surface of the polymer layer may have a TTV less than about 5 micrometers (μm) after planarizing, and a spacing between adjacent dies of the plurality of dies of less than about 3000 μm. Planarization may comprise pressure clamping the top surface of the polymer layer. Forming the polymer layer may comprise laminating a film layer on the molding compound. After planarizing, at least a portion of the polymer layer contacting the non-planar top surface of the molding compound may also comprise a non-planar top surface.

In accordance with another representative embodiment, a method of manufacturing a device package includes the steps of: forming a molding compound along sidewalls of a plurality of dies, wherein the molding compound comprises a non-planar top surface; forming a polymer layer over and contacting the molding compound, wherein a total thickness variation (TTV) of a top surface of the polymer layer is less than a TTV of the non-planar top surface of the molding compound; and forming a conductive feature on the polymer layer, wherein the conductive feature is electrically connected to at least one of the plurality of dies. The non-planar top surface may be disposed between adjacent dies of the plurality of dies, and a portion of the polymer disposed on the non-planar top surface of the molding compound may also comprise a non-planar top surface. A TTV of the portion of the polymer layer may be less than about 15 micrometers (μm) when a spacing between adjacent dies of the plurality of dies is less than about 3000 μm. A TTV of the portion of the polymer layer may be less than about 10 micrometers (μm) when a spacing between adjacent dies of the plurality of dies is less than about 500 μm. A TTV of the portion of the polymer layer may be less than about 5 micrometers (μm) when a spacing between adjacent dies of the plurality of dies is less than about 100 μm. The conductive feature may comprise a non-planar top surface. The non-planar top surface of the molding compound may be concave. The TTV of the non-planar top surface of the molding compound may be about 5 μm to about 30 μm.

In accordance with yet another representative embodiment, a method of fabricating a device package includes the steps of: forming a molding compound along sidewalls of a first die and a second die, the molding compound comprising a non-planar top surface between the first die and the second die, wherein the second die is disposed adjacent the first die; forming a polymer layer over and contacting the molding compound, the polymer layer comprising a non-planar top surface over the non-planar top surface of the molding compound, the non-planar top surface of the polymer layer having a total thickness variation (TTV) less than about 5 micrometers (μm); and forming a conductive line over the polymer layer, wherein at least a portion of the conductive line contacts the non-planar top surface of the polymer layer, and the conductive line is electrically connected to the first die. The method may comprise at least one of the following features: a TTV of the non-planar top surface of the molding compound may be greater than the TTV of the non-planar top surface of the polymer layer; a TTV of the molding compound may be about 5 micrometers (μm) to about 30 μm; a spacing between the first die and the second die may be less than about 3000 μm; or the polymer layer may be substantially continuous. The non-planar top surface of the polymer layer and the non-planar top surface of the molding compound may comprise concave profiles. The portion of the conductive line contacting the non-planar top surface of the polymer layer may comprise a non-planar top surface. A surface portion of the polymer layer may be more planar than a top surface of the molding compound. A through intervia may extend through the molding compound and the polymer layer, wherein the through intervia is electrically coupled to conductive elements formed over the polymer layer. The first die may comprise a contact pad and a passivation layer exposing the contact pad. The polymer layer may contact the contact pad.

In accordance with another embodiment, a device package includes a plurality of dies, a molding compound extending along sidewalls of the plurality of dies, and a polymer layer over and contacting the molding compound. The molding compound comprises a non-planar top surface, and a total thickness variation (TTV) of a top surface of the polymer layer is less than a TTV of the non-planar top surface of the molding compound. The device package further includes a conductive feature on the polymer layer, wherein the conductive feature is electrically connected at least one of the plurality of dies.

In accordance with yet another embodiment, a device package includes a first die, a second die adjacent the first die, a molding compound extending along sidewalls of the first die and the second die, and a polymer layer over and contacting the molding compound. The molding has a non-planar top surface between the first die and the second die, and the polymer layer has a non-planar top surface over the non-planar top surface of the molding compound. The non-planar top surface of the polymer layer has a total thickness variation (TTV) less than about 5 micrometers (μm). The device package further includes a conductive line over the polymer layer, and at least a portion of the conductive line contacts the non-planar top surface of the polymer layer. The conductive line is electrically connected to the first die or the second die.

In accordance with still another embodiment, a method for forming device package includes disposing a plurality of dies on a carrier, forming a molding compound over the carrier and around the plurality of dies, and forming a polymer layer over the plurality of dies. The plurality of dies is covered with a film layer while forming the molding compound, and the molding compound includes a non-planar top surface between adjacent ones of the plurality of dies. The polymer layer contacts the non-planar top surface of molding compound, and forming the polymer layer includes a planarization process so that the top surface of the polymer layer has a total thickness variation (TTV) less than a TTV of the non-planar top surface of the molding compound. The method further includes forming a conductive line on the polymer layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a device package, the method comprising:
disposing a plurality of dies on a carrier;
forming a molding compound over the carrier and around the plurality of dies, the molding compound comprising a non-planar top surface between adjacent dies of the plurality of dies;
covering the plurality of dies with a first film layer while forming the molding compound;
covering the plurality of dies with a polymer layer, the polymer layer contacting the non-planar top surface of the molding compound;
planarizing a top surface of the polymer layer to have a total thickness variation (TTV) less than a TTV of the non-planar top surface of the molding compound; and
forming a conductive line on the polymer layer.

2. The method of claim 1, wherein the top surface of the polymer layer has a TTV less than about 5 micrometers (μm) after planarizing, and a spacing between adjacent dies of the plurality of dies is less than about 3000 μm.

3. The method of claim 1, wherein planarizing comprises pressure clamping the top surface of the polymer layer.

4. The method of claim 1, wherein forming the polymer layer comprises laminating a second film layer on the molding compound.

5. The method of claim 1, wherein after planarizing, at least a portion of the polymer layer contacting the non-planar top surface of the molding compound also comprises a non-planar top surface.

6. A method of manufacturing a device package, the method comprising:
depositing a molding compound along sidewalls of a plurality of dies, wherein the molding compound comprises a non-planar top surface;
forming a polymer layer over and contacting the molding compound, wherein a total thickness variation (TTV) of a top surface of the polymer layer is less than a TTV of the non-planar top surface of the molding compound; and
forming a conductive feature on the polymer layer, wherein the conductive feature is electrically connected to at least one of the plurality of dies.

7. The method of claim 6, wherein the non-planar top surface is disposed between adjacent dies of the plurality of dies, and wherein a portion of the polymer layer disposed on the non-planar top surface of the molding compound also comprises a non-planar top surface.

8. The method of claim 7, wherein a TTV of the portion of the polymer layer is less than about 15 micrometers (μm) when a spacing between adjacent dies of the plurality of dies is less than about 3000 μm.

9. The method of claim 7, wherein a TTV of the portion of the polymer layer is less than about 10 micrometers (μm) when a spacing between adjacent dies of the plurality of dies is less than about 500 μm.

10. The method of claim 7, wherein a TTV of the portion of the polymer layer is less than about 5 micrometers (μm) when a spacing between adjacent dies of the plurality of dies is less than about 100 μm.

11. The method of claim 6, wherein the conductive feature comprises a non-planar top surface.

12. The method of claim 6, wherein the non-planar top surface of the molding compound is concave.

13. The method of claim 6, wherein the TTV of the non-planar top surface of the molding compound is about 5 μm to about 30 μm.

14. A method of fabricating a device package, the method comprising:
depositing a molding compound along sidewalls of a first die and a second die, the molding compound comprising a non-planar top surface between the first die and the second die, wherein the second die is disposed adjacent the first die;
forming a polymer layer over and contacting the molding compound, the polymer layer comprising a non-planar top surface over the non-planar top surface of the molding compound, the non-planar top surface of the polymer layer having a total thickness variation (TTV) less than about 5 micrometers (μm); and
forming a conductive line over the polymer layer, wherein at least a portion of the conductive line contacts the non-planar top surface of the polymer layer, and the conductive line is electrically connected to the first die.

15. The method of claim 14, wherein at least one of:
a TTV of the non-planar top surface of the molding compound is greater than the TTV of the non-planar top surface of the polymer layer;
a TTV of the molding compound is about 5 micrometers (μm) to about 30 μm;
a spacing between the first die and the second die is less than about 3000 μm; or
the polymer layer is substantially continuous.

16. The method of claim 14, wherein the non-planar top surface of the polymer layer and the non-planar top surface of the molding compound comprise concave profiles.

17. The method of claim 14, wherein the portion of the conductive line contacting the non-planar top surface of the polymer layer comprises a non-planar top surface.

18. The method of claim 14, wherein a surface portion of the polymer layer is more planar than a top surface of the molding compound.

19. The method of claim 14 further comprising a through intervia extending through the molding compound and the polymer layer, the through intervia electrically coupled to conductive elements formed over the polymer layer.

20. The method of claim 14, wherein the first die comprises a contact pad and a passivation layer exposing the contact pad, and wherein the polymer layer contacts the contact pad.

* * * * *